(12) United States Patent
Huang et al.

(10) Patent No.: US 12,204,232 B2
(45) Date of Patent: Jan. 21, 2025

(54) SEMICONDUCTOR DEVICE HAVING A GATE ELECTRODE WITH A TOP PERIPHERAL PORTION AND A TOP CENTRAL PORTION, AND THE TOP PERIPHERAL PORTION IS A PROTRUSION OR A DEPRESSION SURROUNDING THE TOP CENTRAL PORTION

(71) Applicant: Taiwan Semiconductor Manufacturing Company, Ltd., Hsin-Chu (TW)

(72) Inventors: Hung-Shu Huang, Taichung (TW); Ming Chyi Liu, Hsinchu (TW); Tung-He Chou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/501,131

(22) Filed: Nov. 3, 2023

(65) Prior Publication Data

US 2024/0061320 A1 Feb. 22, 2024

Related U.S. Application Data

(60) Continuation of application No. 17/868,018, filed on Jul. 19, 2022, now Pat. No. 11,846,871, which is a
(Continued)

(51) Int. Cl.
*G03B 13/36* (2021.01)
*G01S 3/00* (2006.01)
(Continued)

(52) U.S. Cl.
CPC ............... *G03B 13/36* (2013.01); *G01S 3/00* (2013.01); *G06V 10/40* (2022.01); *G06V 10/751* (2022.01);
(Continued)

(58) Field of Classification Search
CPC .......... H04N 5/232127; H04N 5/2258; H04N 5/23218; H04N 5/23238; H04N 5/23293;
(Continued)

(56) References Cited

U.S. PATENT DOCUMENTS 6,040,220 A 3/2000 Gardner et al.
6,093,947 A 7/2000 Hanafi et al.
(Continued)

FOREIGN PATENT DOCUMENTS

KR 20090041152 A * 4/2009 ........... H01L 21/308
KR 20190001233 A 1/2019

OTHER PUBLICATIONS

Notice of Allowance dated May 9, 2022 for U.S. Appl. No. 16/822,424.
(Continued)

*Primary Examiner* — Ermias T Woldegeorgis
(74) *Attorney, Agent, or Firm* — Eschweiler & Potashnik, LLC

(57) ABSTRACT

Various embodiments of the present disclosure provide a method for forming a recessed gate electrode that has high thickness uniformity. A gate dielectric layer is deposited lining a recess, and a multilayer film is deposited lining the recess over the gate dielectric layer. The multilayer film comprises a gate electrode layer, a first sacrificial layer over the gate dielectric layer, and a second sacrificial layer over the first sacrificial dielectric layer. A planarization is performed into the second sacrificial layer and stops on the first sacrificial layer. A first etch is performed into the first and second sacrificial layers to remove the first sacrificial layer at sides of the recess. A second etch is performed into the gate electrode layer using the first sacrificial layer as a mask to form the recessed gate electrode. A third etch is performed to remove the first sacrificial layer after the second etch.

20 Claims, 31 Drawing Sheets

Related U.S. Application Data division of application No. 16/822,424, filed on Mar. 18, 2020, now Pat. No. 11,445,104.

(51) Int. Cl.

| | | |
|---|---|---|
| *G06V 10/40* | (2022.01) | |
| *G06V 10/75* | (2022.01) | |
| *G06V 40/20* | (2022.01) | |
| *H01L 21/00* | (2006.01) | |
| *H01L 21/3213* | (2006.01) | |
| *H01L 21/8234* | (2006.01) | |
| *H01L 29/423* | (2006.01) | |
| *H01L 29/66* | (2006.01) | |
| *H01L 29/78* | (2006.01) | |
| *H04N 5/262* | (2006.01) | |
| *H04N 23/45* | (2023.01) | |
| *H04N 23/61* | (2023.01) | |
| *H04N 23/63* | (2023.01) | |
| *H04N 23/67* | (2023.01) | |
| *H04N 23/69* | (2023.01) | |
| *H04N 23/698* | (2023.01) | |
| *H04N 23/90* | (2023.01) | |

(52) U.S. Cl.
CPC .............. *G06V 40/20* (2022.01); *H01L 21/00* (2013.01); *H01L 21/32139* (2013.01); *H01L 21/823456* (2013.01); *H01L 29/42372* (2013.01); *H01L 29/42376* (2013.01); *H01L 29/4238* (2013.01); *H01L 29/42384* (2013.01); *H01L 29/66613* (2013.01); *H01L 29/66621* (2013.01); *H01L 29/66628* (2013.01); *H01L 29/7834* (2013.01); *H01L 29/7835* (2013.01); *H01L 29/7836* (2013.01); *H04N 5/2628* (2013.01); *H04N 23/45* (2023.01); *H04N 23/61* (2023.01); *H04N 23/63* (2023.01); *H04N 23/675* (2023.01); *H04N 23/69* (2023.01); *H04N 23/698* (2023.01); *H04N 23/90* (2023.01)

(58) Field of Classification Search
CPC .. H04N 5/23296; H04N 5/247; H04N 5/2628; G01S 3/00; G03B 13/36; G06V 10/40; G06V 10/751; G06V 40/20; H01L 21/00; H01L 29/78; H01L 21/28008; H01L 29/42356; H01L 29/42376; H01L 29/66477; H01L 29/66795; H01L 29/7856; H01L 29/404; H01L 29/4236; H01L 29/66621; H01L 21/823437; H01L 21/823456; H01L 21/823828; H01L 21/82385; H01L 29/66613; H01L 29/66628; H01L 29/66704; H01L 29/66734; H01L 29/7813; H01L 29/7825
See application file for complete search history.

(56) References Cited

U.S. PATENT DOCUMENTS

| | | |
|---|---|---|
| 9,601,489 B2 | 3/2017 | Chern et al. |
| 2004/0110331 A1* | 6/2004 | Yeo ..................... H01L 27/1211 257/E21.442 |
| 2006/0006478 A1 | 1/2006 | Kanegae et al. |
| 2007/0075374 A1* | 4/2007 | Kudou ................ H01L 27/0629 257/E21.624 |
| 2008/0073706 A1* | 3/2008 | Hayashi ............. H01L 29/7834 257/E29.267 |
| 2010/0102396 A1 | 4/2010 | Kanegae et al. |
| 2013/0056795 A1 | 3/2013 | Wu et al. |
| 2014/0367801 A1* | 12/2014 | Liu ................ H01L 21/823456 257/407 |
| 2016/0099340 A1 | 4/2016 | Hsu |
| 2016/0351625 A1 | 12/2016 | Gee et al. |

OTHER PUBLICATIONS

Non-Final Office Action dated Dec. 20, 2022 for U.S. Appl. No. 17/868,018.
Final Office Action dated Mar. 30, 2023 for U.S. Appl. No. 17/868,018.
Notice of Allowance dated Aug. 11, 2023 for U.S. Appl. No. 17/868,018.

* cited by examiner

SEMICONDUCTOR DEVICE HAVING A GATE ELECTRODE WITH A TOP PERIPHERAL PORTION AND A TOP CENTRAL PORTION, AND THE TOP PERIPHERAL PORTION IS A PROTRUSION OR A DEPRESSION SURROUNDING THE TOP CENTRAL PORTION

REFERENCE TO RELATED APPLICATIONS

This Application is a Continuation of U.S. application Ser. No. 17/868,018, filed on Jul. 19, 2022, which is a Divisional of U.S. application Ser. No. 16/822,424, filed on Mar. 18, 2020 (now U.S. Pat. No. 11,445,104, issued on Sep. 13, 2022). The contents of the above-referenced patent applications are hereby incorporated by reference in their entirety.

BACKGROUND

An integrated circuit (IC) may include low voltage (LV) metal-oxide-semiconductor (MOS) devices and high voltage (HV) MOS devices. A MOS device comprises a gate electrode and a gate dielectric layer separating the gate electrode from a substrate. The HV MOS devices often have thicker gate dielectric layers than the LV MOS devices and hence often have greater heights than the LV MOS devices. However, the greater heights may increase the difficulty of integrating a manufacturing process for the HV MOS devices with a manufacturing process for the LV MOS devices. Hence, gate electrodes of the HV MOS devices may be recessed into a substrate to minimize the impact from the increased height.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
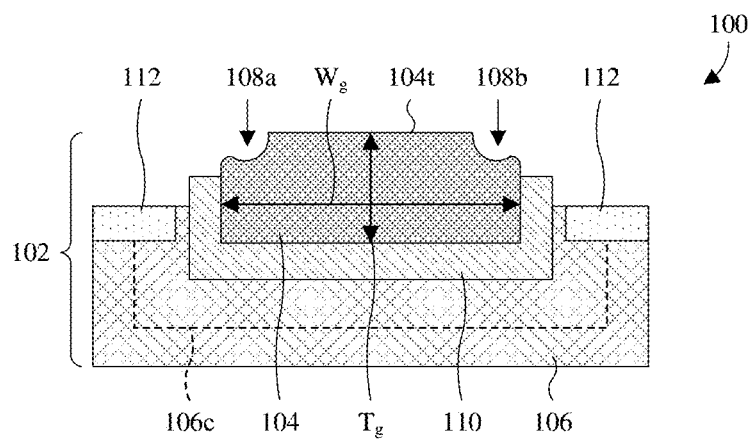
FIG. 1 illustrates a cross-sectional view of some embodiments of a semiconductor device comprising a recessed gate electrode that has high thickness uniformity.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the present disclosure are directed towards a method for forming a semiconductor device comprising a recessed gate electrode that has high thickness uniformity, as well as the semiconductor device resulting from the method. In some embodiments, a recess is formed overlying a substrate. A gate dielectric layer is deposited lining and partially filling the recess, and a multilayer film is deposited filling a remainder of the recess over the gate dielectric layer. The multilayer film comprises a gate electrode layer, a first sacrificial layer over the gate dielectric layer, and a second sacrificial layer over the first sacrificial dielectric layer. A planarization is performed into the second sacrificial layer and stops on the first sacrificial layer. A first etch is performed into the first sacrificial layer to remove portions of the first sacrificial layer at sides of the recess. A second etch is performed into the gate electrode layer using the first sacrificial layer as a mask to remove portions of the gate electrode layer at sides of the recess and to form the recessed gate electrode underlying the first sacrificial layer in the recess. The first etch and, in some embodiments, the second etch remove(s) the second sacrificial layer. A third etch is performed to remove the first sacrificial layer. In some embodiments, the first and second etches are performed by dry etching, whereas the third etch is performed by wet etching. Other etching types are, however, amenable.

In some embodiments, the multilayer film is deposited so each individual layer of the multilayer film is indented over the recess. As such, a portion of the second sacrificial layer remains directly over the recess upon completion of the planarization. The remaining portion of the second sacrificial layer serves as a mask to protect an underlying portion of the first sacrificial layer during the first etch so the first sacrificial layer is not removed from directly over the recess. The first sacrificial layer serves as a mask during the second etch, and persists to completion of the second etch, so as to protect an underlying portion of the gate electrode layer that corresponds to the recessed gate electrode. As such, the recessed gate electrode remains protected by the first sacrificial layer throughout the second etch and may have the same thickness that the gate electrode layer was deposited with.

Because deposition processes may form the gate electrode layer with high thickness uniformity, the recessed gate electrode may have high thickness uniformity. Further, because the recessed gate electrode remains protected by the first sacrificial layer throughout the second etch, a top surface of the recessed gate electrode may have a high degree of flatness. The high thickness uniformity and the high degree of flatness may lead to high uniformity with electrical properties of the recessed gate electrode and/or the semiconductor device when the semiconductor device is manufactured in bulk. For example, a resistance of the recessed gate electrode and/or a work function of the recessed gate electrode may have high uniformity, such that a threshold voltage of the semiconductor device may have high uniformity.

With reference to FIG. 1, a cross-sectional view 100 of some embodiments of a semiconductor device 102 comprising a recessed gate electrode 104 that has high thickness uniformity is provided. The recessed gate electrode 104 is recessed into a top of a substrate 106. The recessed gate electrode 104 may, for example, be or comprise metal, doped polysilicon, some other suitable conductive material(s), or any combination of the foregoing. The substrate 106 may, for example be or comprise a monocrystalline silicon substrate, a silicon-on-insulator (SOI) substrate, or some other suitable semiconductor substrate.

A top surface 104t of the recessed gate electrode 104 has a high degree of flatness (e.g., is flat or substantially flat) between a first feature 108a and a second feature 108b that are respectively on opposite sides of the recessed gate electrode 104 and that are at a periphery of the recessed gate electrode 104. Further, a thickness $T_g$ of the recessed gate electrode 104 has high uniformity (e.g., is uniform or substantially uniform) between the first and second features 108a, 108b. In at least some embodiments, the top surface 104t has the high degree of flatness and the thickness $T_g$ has high uniformity because of formation of the recessed gate electrode 104 according to a method of the present disclosure.

As seen hereafter, at least some embodiments of the method may form the recessed gate electrode 104 from a multilayer film using both planarization and etching. Further, the planarization and the etching may be performed in a manner that prevents exposure of the recessed gate electrode 104 to the planarization and that limits exposure of the recessed gate electrode 104 to etchants at a periphery of the recessed gate electrode 104. This limited exposure to the etchants may lead to the first and second features 108a, 108b. Because the recessed gate electrode 104 is limited to exposure at the periphery of the recessed gate electrode 104, the thickness $T_g$ is as deposited at a remainder of the recessed gate electrode 104. Because deposition processes may deposit material with high thickness uniformity, the thickness $T_g$ at the remainder of the recessed gate electrode 104 may have high uniformity.

In some embodiments, the top surface 104t of the recessed gate electrode 104 has a high degree of flatness if a difference between a highest elevation on the top surface 104t and a lowest elevation on the top surface 104t is less than about 1 percent, 2 percent, 5 percent, or some other suitable percent of the highest elevation. Further, in some embodiments, the thickness $T_g$ has high uniformity if a difference between a minimum thickness value and a maximum thickness value is less than about 1 percent, 2 percent, 5 percent, or some other suitable percent of the maximum thickness value. If the top surface 104t has too much variation (e.g., variation greater than about 5 percent or some other suitable percent of the highest elevation), and/or the thickness $T_g$ has too much variation (e.g., variation greater than about 5 percent or some other suitable percent of the maximum thickness value), electrical properties of the recessed gate electrode 104 and/or electrical properties of the semiconductor device 102 may undergo large shifts and/or may be shifted out of specification. The electrical properties may include, for example, gate resistance, gate work function, threshold voltage, other suitable properties, or any combination of the foregoing.

In some embodiments, the thickness $T_g$ is about 20-200 nanometers, about 20-110 nanometers, about 110-200 nanometers, about 100.16 nanometers, about 100.35 nanometers, or some other suitable values. If the thickness $T_g$ is too small (e.g., less than about 20 nanometers or some other suitable value), over etching may extend through the recessed gate electrode 104 during formation of a contact via on the recessed gate electrode 104 and cause damage to a gate dielectric layer 110 underlying the recessed gate electrode 104. Such damage may shift operating parameters of the semiconductor device 102 out of specification and/or degrade performance of the semiconductor device 102. If the thickness $T_g$ is too large (e.g., greater than about 200 nanometers or some other suitable value), integration with other semiconductor devices on the substrate 106 may be difficult. For example, a top surface of the semiconductor device 102 may be elevated above top surfaces of the other semiconductor devices to such an extent that chemical mechanical polish (CMP) loading at semiconductor device 102 may be too high. As a result, planarized surfaces may be angled and/or non-uniform instead of substantially horizontal and/or substantially flat. This may lead to overlay errors and/or other process difficulties.

The first and second features 108a, 108b are concave recesses and/or depressions in a top of the recessed gate electrode 104. In alternative embodiments, the first and second features 108a, 108b are upward protrusions, inverted rounded corners, or some other suitable features. The first and second features 108a, 108b are characterized as features because the first and second features 108a, 108b introduce non-uniformities into the thickness $T_g$ of the recessed gate electrode 104. As seen hereafter, and briefly mentioned above, the first and second features 108a, 108b may, for example, be a byproduct of the method used to form the recessed gate electrode 104.

In some embodiments, the first feature 108a is a mirror image of the second feature 108b. Further, in some embodiments, the first and second features 108a, 108b occupy a small percentage of surface area in a two-dimensional (2D) projection of the recessed gate electrode 104 onto a top surface of the substrate 106 and/or onto a horizontal plane. The 2D projection of the recessed gate electrode 104 may, for example, also be known as a footprint of the recessed gate electrode 104. The small percentage may, for example, be a percentage less than about 5, 10, or 20 percent or some other suitable percentage.

Because the first and second features 108a, 108b introduce non-uniformities into the thickness $T_g$ of the recessed gate electrode 104, the thickness $T_g$ becomes more uniform as the first and second features 108a, 108b occupy less surface area. If the first and second features 108a, 108b occupy too much surface area (e.g., greater than about 20 percent or some other suitable percentage), electrical properties of the recessed gate electrode 104 may undergo large shifts and/or may be shifted out of specification.

The gate dielectric layer 110 cups an underside of the recessed gate electrode 104 and separates the recessed gate electrode 104 from the substrate 106. The gate dielectric layer 110 may be or comprise, for example, silicon oxide and/or some other suitable dielectric(s). Further, a pair of source/drain regions 112 is in the substrate 106. The source/drain regions 112 are respectively on opposite sides of the recessed gate electrode 104. The source/drain region 112 may be or comprise, for example, a doped semiconductor region of the substrate 106 and/or an epitaxial layer grown on the substrate 106.

A channel region 106c underlies the recessed gate electrode 104 in the substrate 106 and extends from one of the source/drain regions 112 to another one of the source/drain regions 112. The channel region 106c is configured to change between a conductive state and a non-conductive state depending upon a bias voltage applied to the recessed gate electrode 104. For example, the channel region 106c may change to the conducting state when the recessed gate electrode 104 is biased with a voltage above a threshold voltage. As another example, the channel region 106c may change to the non-conducting state when the recessed gate electrode 104 is biased with a voltage below the threshold voltage.

In some embodiments, the semiconductor device 102 is a field-effect transistor (FET), some other suitable transistor, a memory cell, or some other suitable semiconductor device. In some embodiments, the semiconductor device 102 is large. The semiconductor device 102 may, for example, be large when a width W g of the recessed gate electrode 104 is greater than about 20 micrometer, 30 micrometers, or some other suitable value. Further, the semiconductor device 102 may, for example, have such a large width when used for a HV application or some other suitable application. A high voltage (HV) application may, for example, be an application in which the semiconductor device 102 operates at voltages in excess of 100 volts, 200 volts, 600 volts, 1200 volts, or some other suitable value.

Figure 2A:
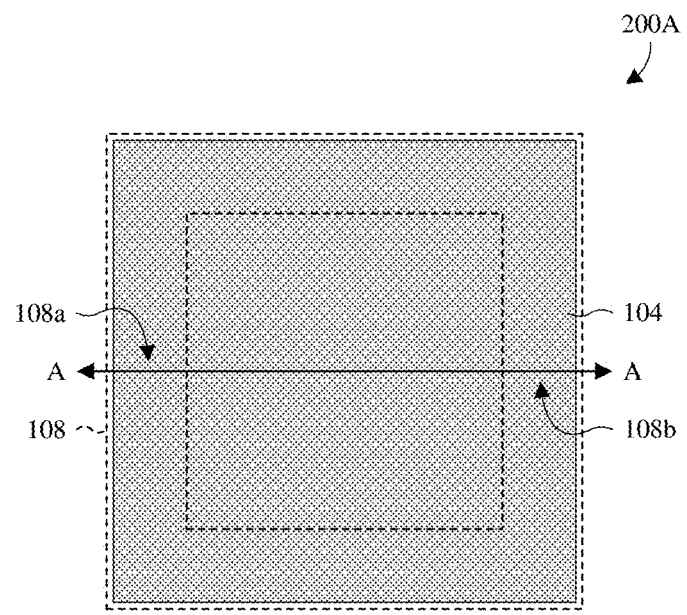
FIGS. 2A and 2B illustrate top layouts of various embodiments of the recessed gate electrode of FIG. 1.
Figure 2B:
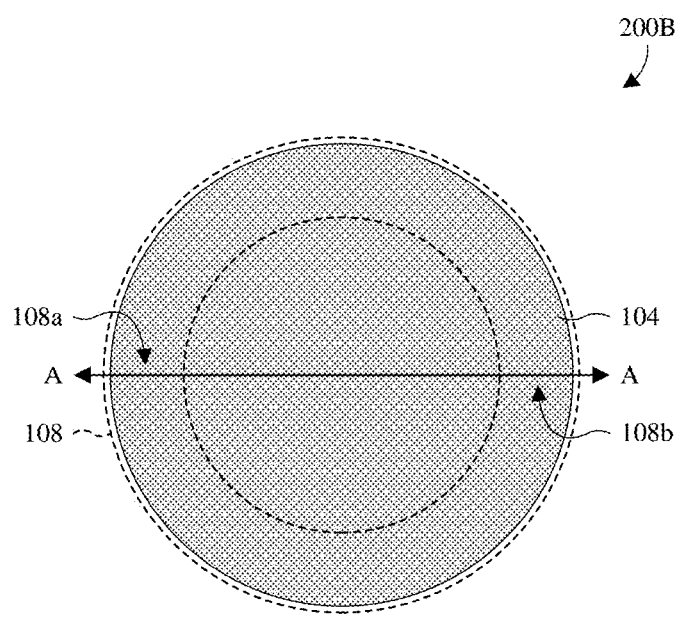

With reference to FIGS. 2A and 2B, top layouts 200A, 200B of various embodiments of the recessed gate electrode 104 of FIG. 1 is provided. The cross-sectional view 100 of FIG. 1 may, for example, be taken along line A in either one of FIGS. 2A and 2B or along some other suitable line (not shown) in either one of FIGS. 2A and 2B.

The first and second features 108a, 108b correspond to regions of a ring-shaped feature 108 (shown in phantom) extending in a closed path along an edge of the recessed gate electrode 104. In FIG. 2A, the recessed gate electrode 104 is square shaped and the ring-shaped feature 108 is square ring shaped. In FIG. 2B, the recessed gate electrode 104 is circular and the ring-shaped feature 108 is circular ring shaped. While FIGS. 2A and 2B provide specific shapes for the recessed gate electrode 104 and the ring-shaped feature 108, other shapes are amenable for the recessed gate electrode 104 and the ring-shaped feature 108.

Figure 3:
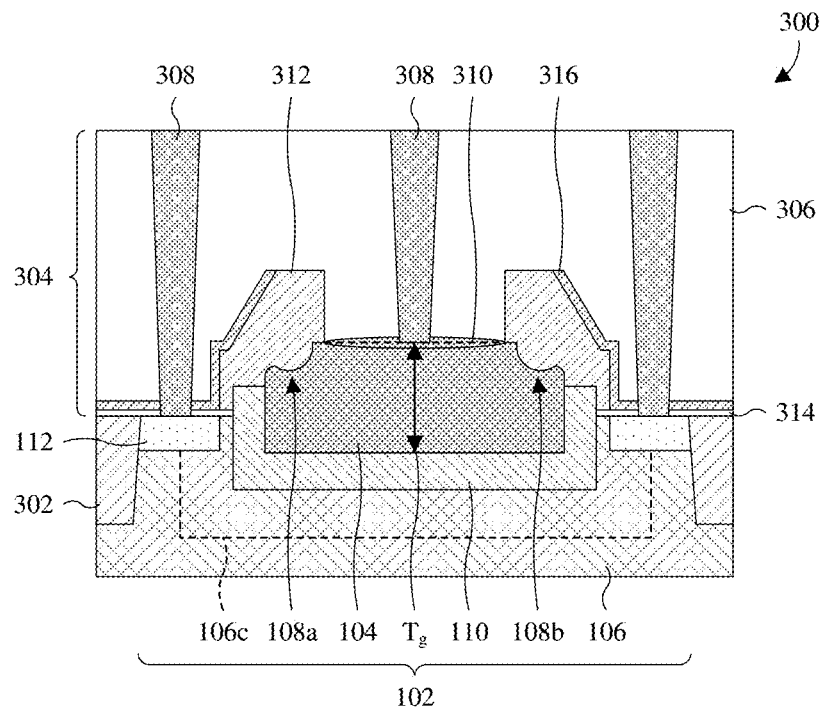
FIG. 3 illustrates a cross-sectional view of some embodiments of an integrated circuit (IC) comprising the semiconductor device of FIG. 1.

With reference to FIG. 3, a cross-sectional view 300 of some embodiments of an integrated circuit (IC) comprising the semiconductor device 102 of FIG. 1 is provided. The semiconductor device 102 is surrounded by a trench isolation structure 302. The trench isolation structure 302 extends into a top of the substrate 106 and provides electrical isolation between the semiconductor device 102 and other semiconductor devices (not shown). The trench isolation structure 302 is or comprises silicon oxide and/or some other suitable dielectric(s). Further, the trench isolation structure 302 may be or comprise, for example, a shallow trench isolation (STI) structure or some other suitable trench isolation structure.

An interconnect structure 304 overlies the substrate 106 and the semiconductor device 102 and comprises an interlayer dielectric (ILD) layer 306 and a plurality of contact vias 308. The contact vias 308 are in the ILD layer 306 and extend respectively to the source/drain regions 112 and the recessed gate electrode 104. In some embodiments, the interconnect structure 304 further comprise a plurality of wires (not shown) and a plurality of inter-wire vias (not shown) alternatingly stacked over the contact vias 308 to define conductive paths leading from the contact vias 308. The ILD layer 306 may be or comprise, for example, silicon oxide and/or some other suitable dielectric(s). The contact vias 308 may be or comprise, for example, metal and/or some other suitable conductive material(s).

A silicide layer 310 is on the recessed gate electrode 104 and provides ohmic coupling between the recessed gate electrode 104 and a corresponding contact via. In alternative embodiments, the silicide layer 310 is omitted. Further, in alternative embodiments, silicide layers (not shown) are on the source/drain regions 112 to provide ohmic coupling between the source/drain regions 112 and corresponding contact vias. The silicide layer 310 may be or comprise, for example, nickel silicide and/or some other suitable metal silicide.

A hard mask 312 is on the recessed gate electrode 104 and the gate dielectric layer 110. The hard mask 312 has a pair of segments respectively bordering opposite edges of the silicide layer 310, and the segments extend respectively from the source/drain regions 112 respectively to the opposite edges. As seen hereafter, the hard mask 312 may, for example, be employed as a mask during formation of the source/drain regions 112 and/or the silicide layer 310. The hard mask 312 may, for example, be or comprise silicon nitride, silicon oxide, some other suitable dielectric(s), or any combination of the foregoing.

A base dielectric layer 314 is on the trench isolation structure 302 and the substrate 106 at sides of the gate dielectric layer 110 and is between the hard mask 312 and the substrate 106. Further, a contact etch stop layer (CESL) 316 is on the base dielectric layer 314 and the hard mask 312. As seen hereafter, the CESL 316 may be used as an etch stop while etching openings within which contact vias corresponding to the source/drain regions 112 are formed. The base dielectric layer 314 may be or comprise, for example, silicon oxide and/or some other suitable dielectric(s). The CESL 316 may, for example, be or comprise silicon nitride and/or some other suitable dielectric(s).

Figure 4:
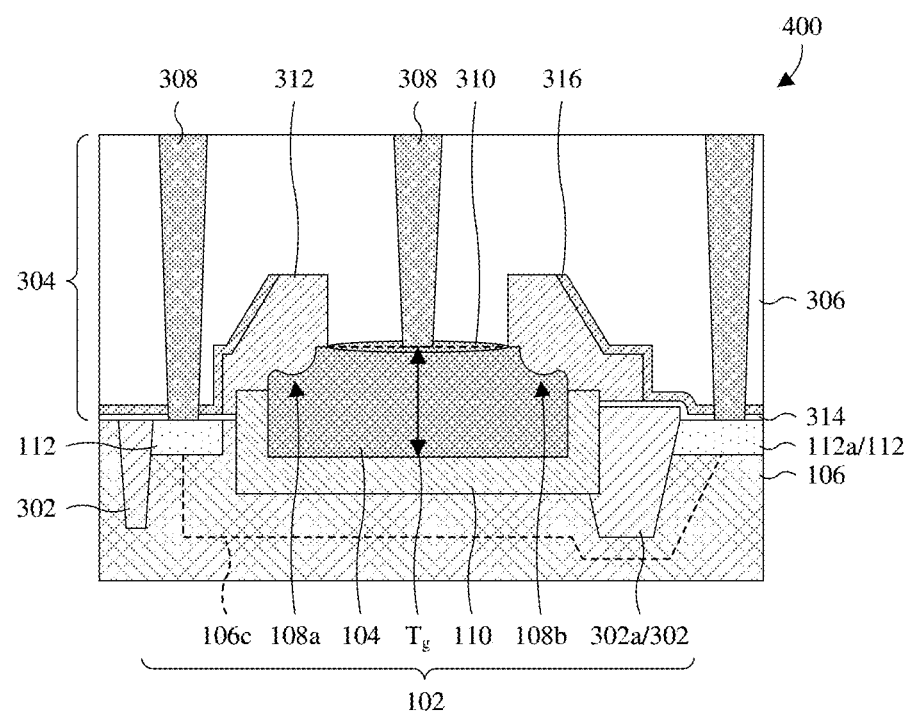
FIG. 4 illustrates a cross-sectional view of some alternative embodiments of the IC of FIG. 3 in which a trench isolation structure and a channel region are varied.

With reference to FIG. 4, a cross-sectional view 400 of some alternative embodiments of the IC of FIG. 3 is provided in which a segment 302a of the trench isolation structure 302 separates a neighboring source/drain region 112a from the recessed gate electrode 104. As a result, the channel region 106c conforms around a bottom of this trench isolation segment 302a and has an increased length. Further, a portion of the channel region 106c at the neighboring source/drain region 112a and the trench isolation segment 302a is farther from the recessed gate electrode 104 than a remainder of the channel region 106c. As a result, this portion of the channel region 106c depends upon a stronger electric field to change between conducting and non-conducting states than the remainder of the channel region 106c. This, in turn, allows the semiconductor device 102 to operate at higher voltages.

Figure 5A:
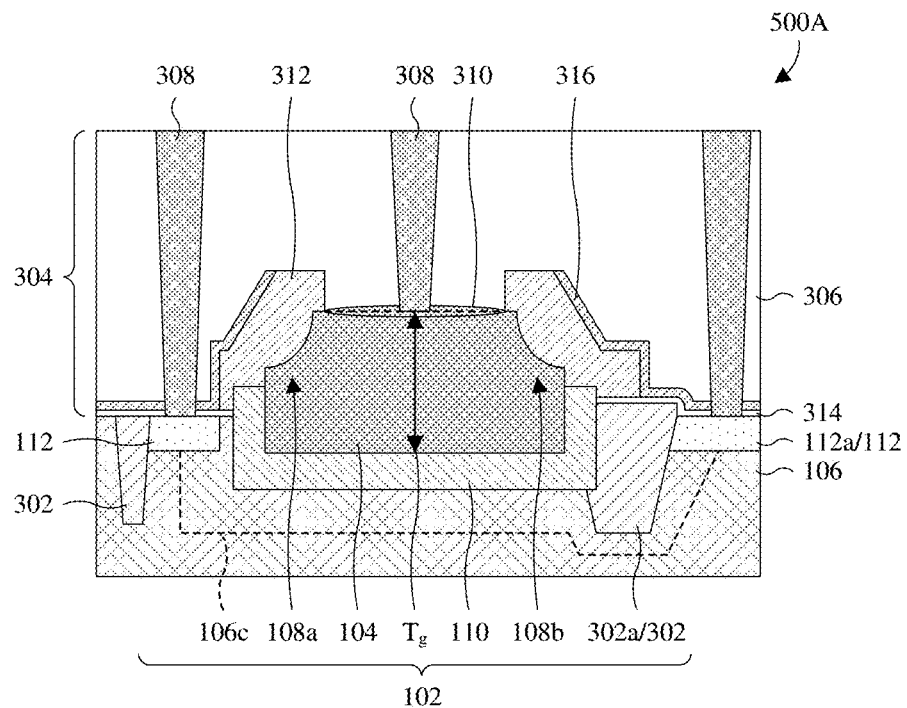
FIGS. 5A-5F illustrate cross-sectional views of various alternative embodiments of the IC of FIG. 4 in which the recessed gate electrode is varied.
Figure 5B:
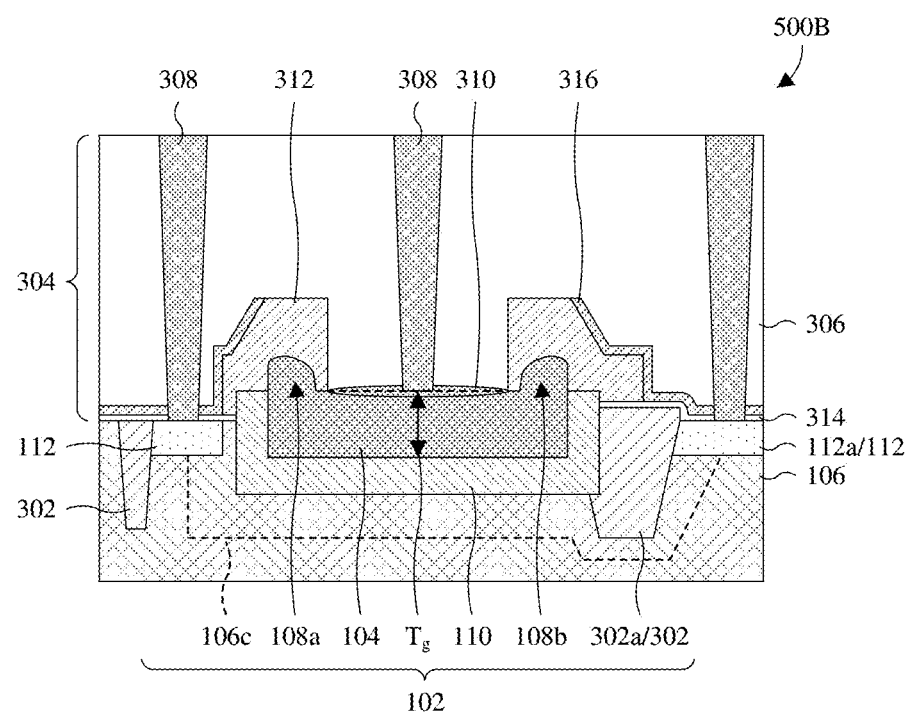
Figure 5C:
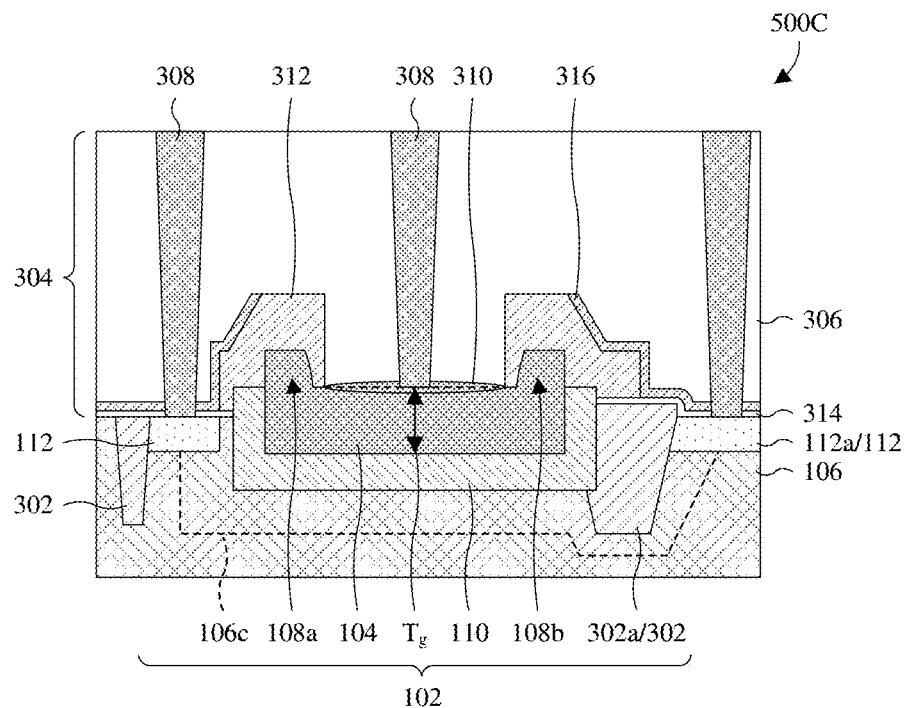
Figure 5D:
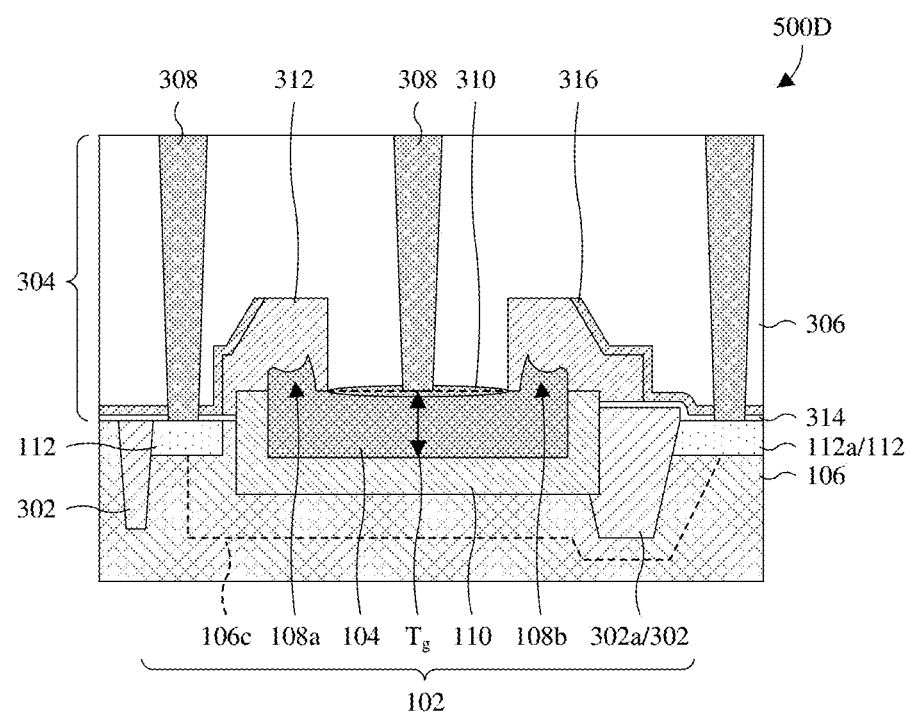

With reference to FIGS. 5A-5F, cross-sectional views 500A-500F of various alternative embodiments of the IC of FIG. 4 are provided in which the recessed gate electrode 104 is varied. In FIG. 5A, the first and second features 108a, 108b are inverted rounded and/or depressed corners. In some embodiments, the inverted rounded and/or depressed corners arc downward with a decreasing slope continuously from a top surface of the recessed gate electrode 104 to a sidewall of the recessed gate electrode 104. In FIG. 5B, the first and second features 108a, 108b are protrusions that protrude upward and that have rounded tops. In FIG. 5C, the first and second features 108a, 108b are protrusions that protrude upward and that have flat or substantially flat tops. In FIG. 5D, the first and second features 108a, 108b are protrusions that protrude upward and that have top surfaces with concave recesses.

Figure 5E:
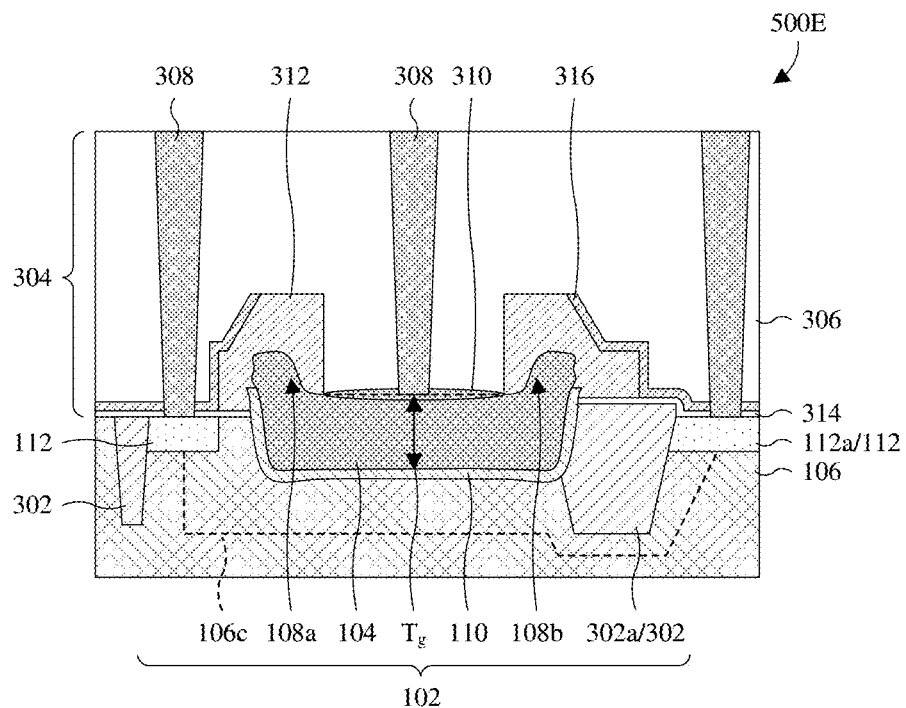
Figure 5F:
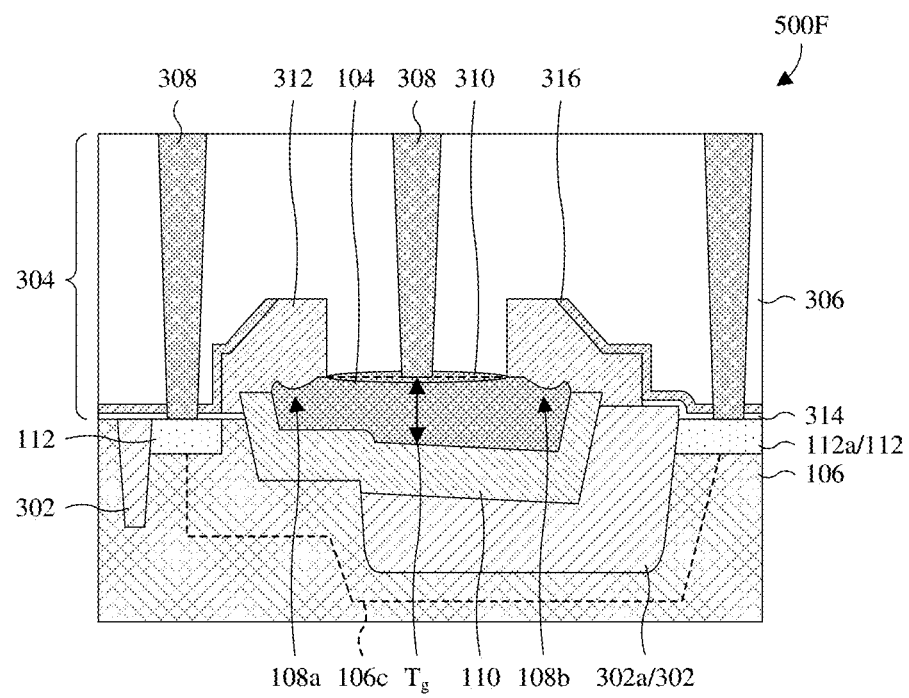

In both FIGS. 5E and 5F, the recessed gate electrode 104 and the gate dielectric layer 110 are less rectilinear and have, among other things, more rounded edges and more slanted sidewalls. In FIG. 5E, the first and second features 108a, 108b are protrusions. In FIG. 5F, the recessed gate electrode 104 partially overlies a segment 302a of the trench isolation structure 302 and has a bottom surface that is uneven and changes elevation at the segment 302a. Further, the thickness $T_g$ of the recessed gate electrode 104 increases towards a source/drain region 112a neighboring the segment 302a of the trench isolation structure 302. Arranging the recessed gate electrode 104 over the trench isolation segment 302a may enable the semiconductor device 102 to operate at higher voltage because the trench isolation structure 302 dissipates an electric field produced by the recessed gate electrode 104.

While FIGS. 2A and 2B are described with regard to the recessed gate electrode 104 of FIG. 1, it is to be appreciated that FIGS. 2A and 2B are applicable to the recessed gate electrode 104 in any one of FIGS. 3, 4, and 5A-5F. For example, any one of FIGS. 3, 4, and 5A-5F may be taken along line A in either one of FIGS. 2A and 2B or along some other suitable line (not shown) in either one of FIGS. 2A and 2B. While the trench isolation structure 302 and the channel region 106c in FIGS. 5A-5F are configured as in FIG. 4, the trench isolation structure 302 and the channel region 106c may alternatively be configured as in FIGS. 1 and 3.

Figure 6:
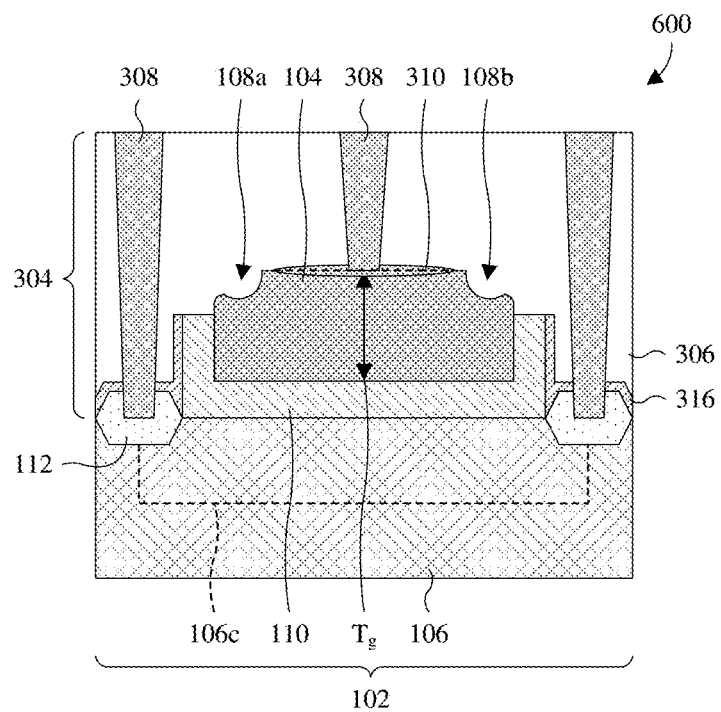
FIG. 6 illustrates a cross-sectional view of some alternative embodiments of the IC of FIG. 3 in which the recessed gate electrode is recessed into a gate dielectric layer but not a substrate.

With reference to FIG. 6, a cross-sectional view 600 of some alternative embodiments of the IC of FIG. 3 is provided in which the recessed gate electrode 104 is recessed into the gate dielectric layer 110 but not the substrate 106. Further, the source/drain regions 112 have top surfaces elevated above a top surface of the substrate 106, the base dielectric layer 314 and the hard mask 312 are omitted, and the CESL 316 is on sidewalls of the gate dielectric layer 110. In alternative embodiments, the base dielectric layer 314 and/or the hard mask 312 remain(s).

Figure 7A:
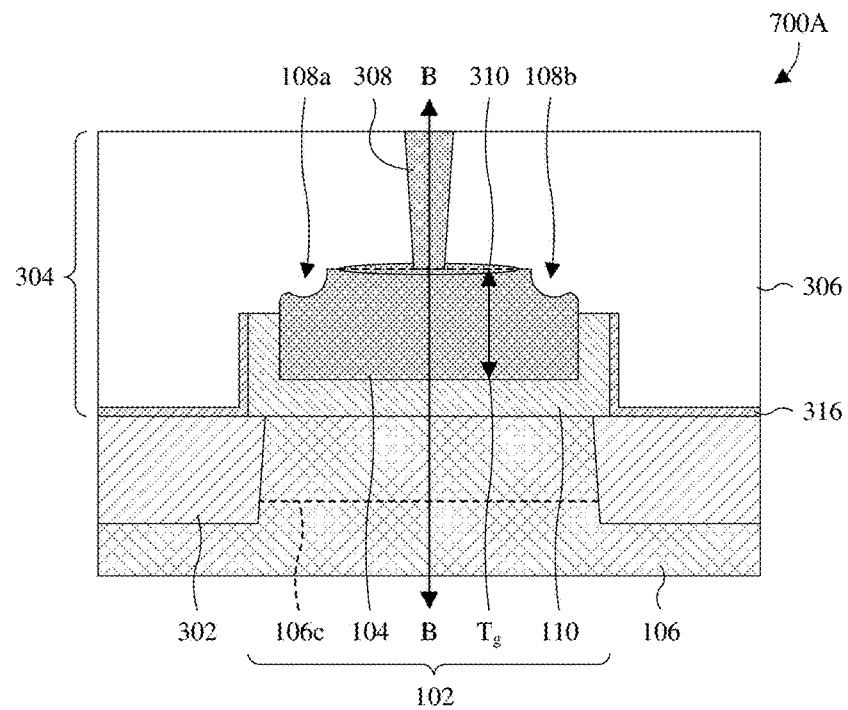
FIGS. 7A and 7B illustrate cross-sectional views of various embodiments of the IC of FIG. 6 in a direction orthogonal to the cross-sectional view of FIG. 6.
Figure 7B:
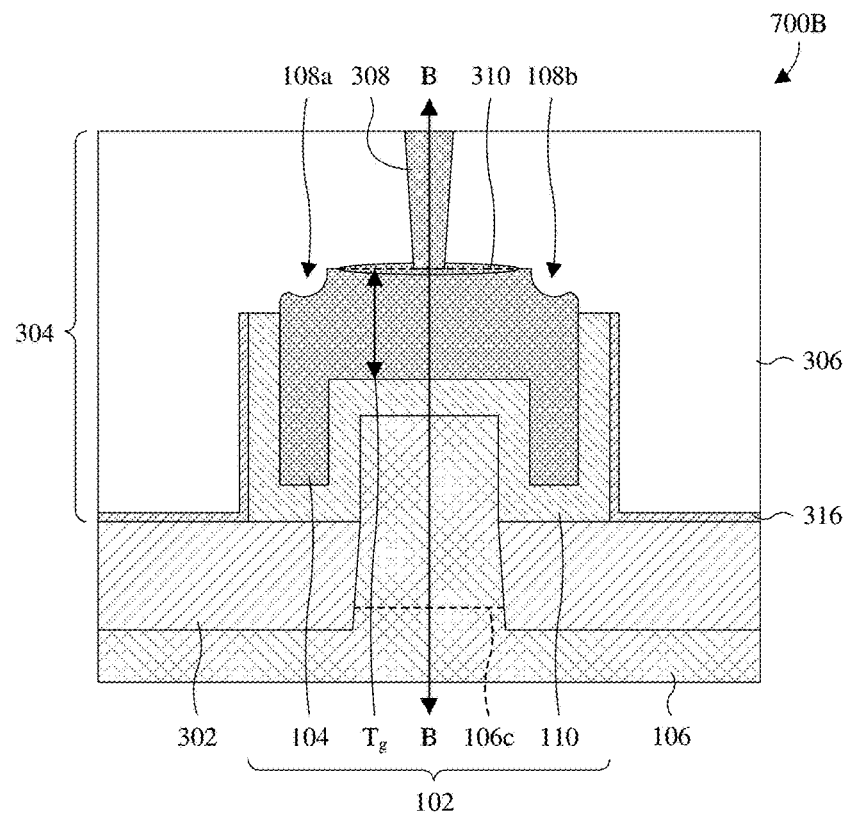

With reference to FIGS. 7A and 7B, cross-sectional views 700A, 700B of various embodiments of the IC of FIG. 6 in a direction orthogonal to the cross-sectional view 600 of FIG. 6 is provided. The cross-sectional views 700A, 700B of FIGS. 7A and 7B are alternative embodiments of each other, and the cross-sectional view 600 of FIG. 6 may, for example, be taken along line B in either one of FIGS. 7A and 7B. In FIG. 7A, the semiconductor device 102 is a planar FET, such that a bottom surface of the recessed gate electrode 104 is planar or substantially planar. In FIG. 7B, the semiconductor device 102 is a finFET, such that the bottom surface of the recessed gate electrode 104 wraps around a top of fin defined by the substrate 106. In both FIGS. 7A and 7B, the semiconductor device 102 partially overlies the trench isolation structure 302.

Figure 8A:
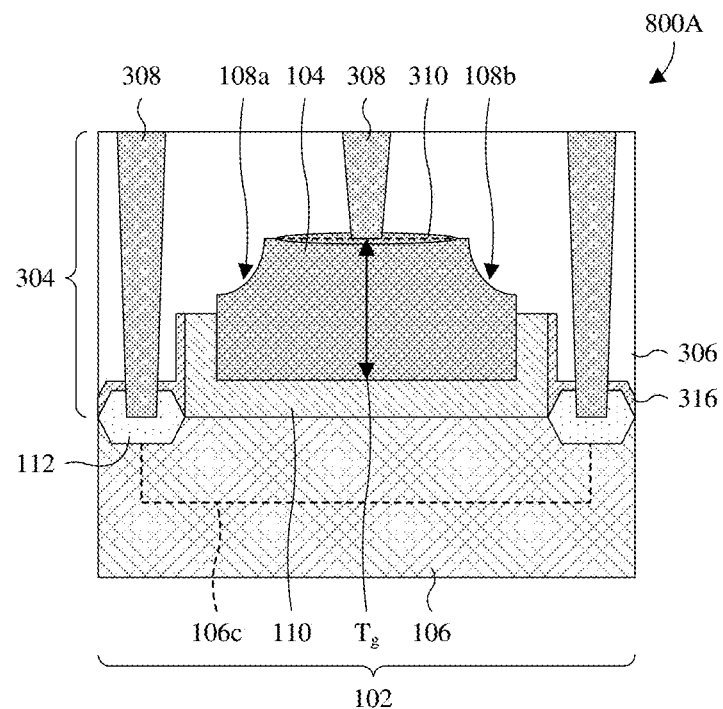
FIGS. 8A-8C illustrate cross-sectional views of various alternative embodiments of the IC of FIG. 6 in which the recessed gate electrode is varied.
Figure 8B:
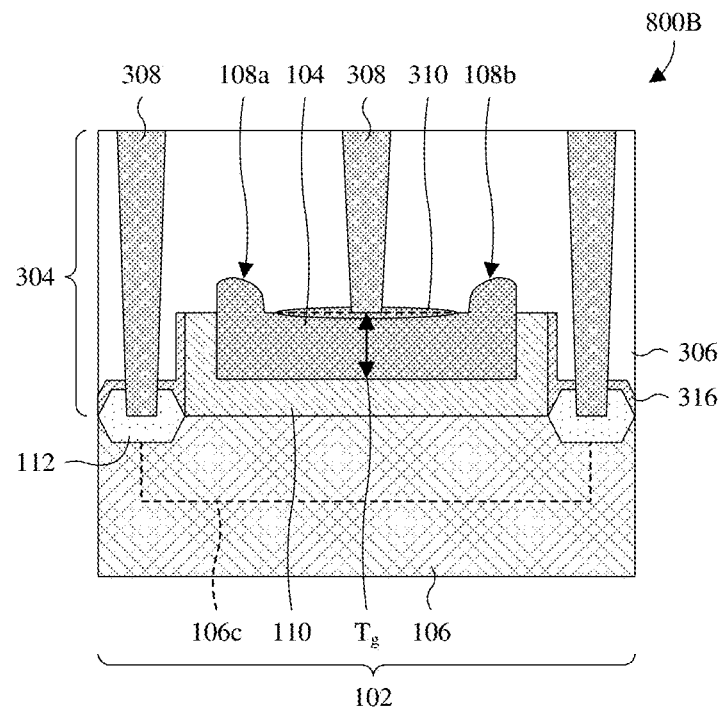
Figure 8C:
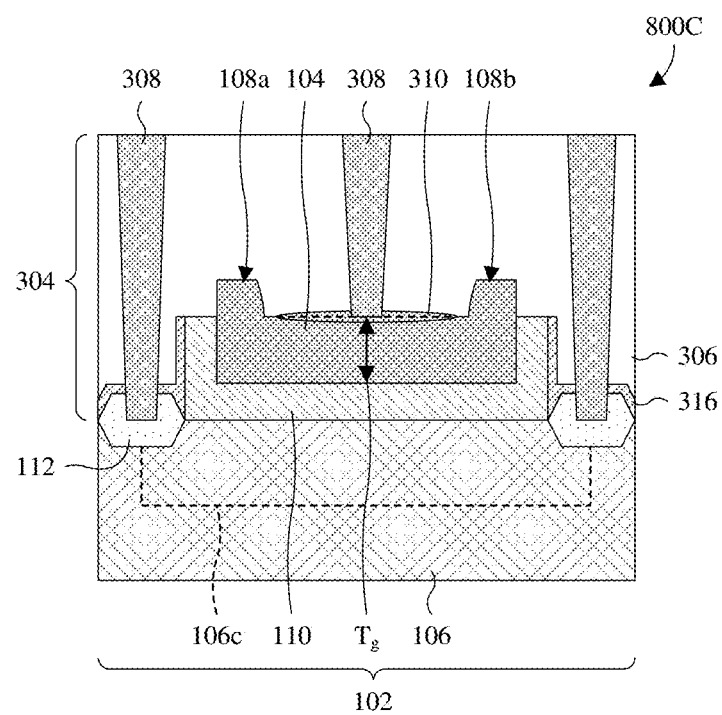

With reference to FIGS. 8A-8C, cross-sectional views 800A-800C of various alternative embodiments of the IC of FIG. 6 are provided in which the recessed gate electrode 104 is varied. In FIG. 8A, the first and second features 108a, 108b are inverted rounded corners. In FIG. 8B, the first and second features 108a, 108b are protrusions that protrude upward and that have rounded tops. In FIG. 8C, the first and second features 108a, 108b are protrusions that protrude upward and that have flat or substantially flat tops. In alternative embodiments, the recessed gate electrode 104 may be as in any one of FIGS. 1, 3, 4, and 5A-5F.

Figure 9:
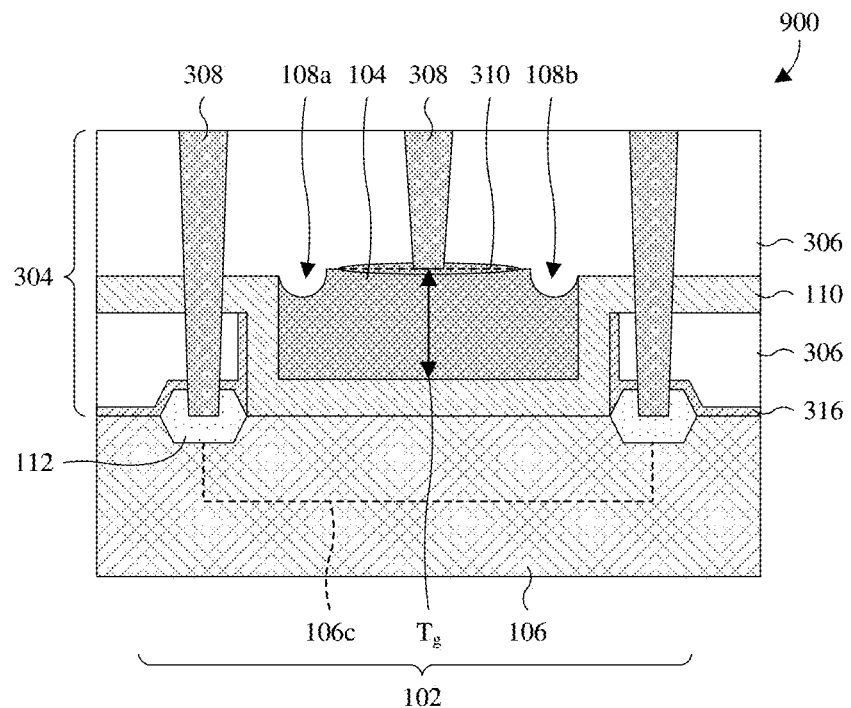
FIG. 9 illustrates a cross-sectional view of some alternative embodiments of the IC of FIG. 6 in which the gate dielectric layer overlies source/drain regions.

With reference to FIG. 9, a cross-sectional view 900 of some alternative embodiments of the IC of FIG. 6 is provided in which the gate dielectric layer 110 overlies the source/drain regions 112. Further, the first and second features 108a, 108b are more symmetrical and a top surface of the recessed gate electrode 104 is elevated above a top surface of the gate dielectric layer 110. In alternative embodiments, the top surface of the recessed gate electrode 104 may be about even with or recessed below the top surface of the gate dielectric layer 110.

Figure 10:
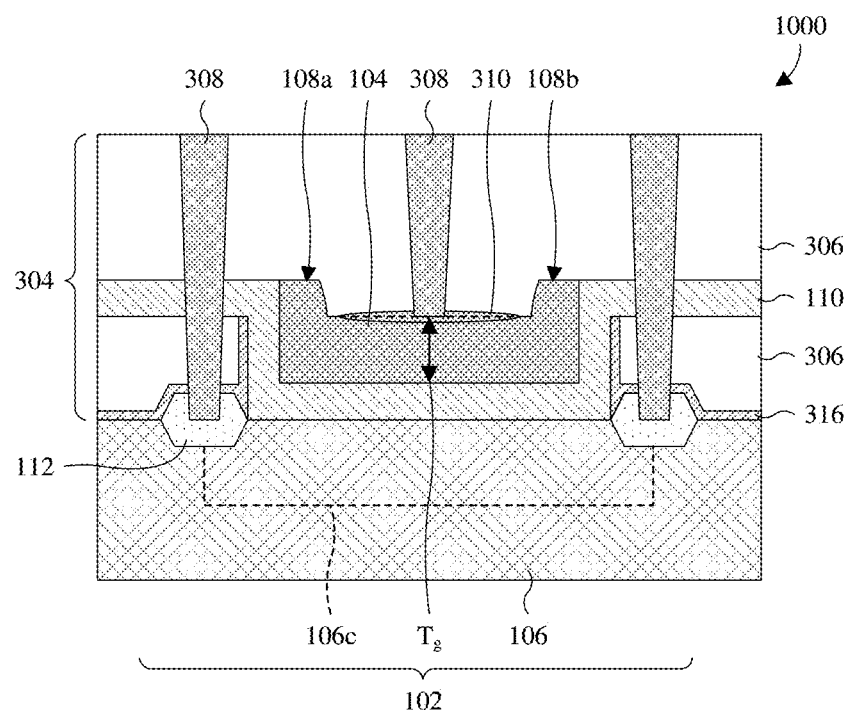
FIG. 10 illustrates a cross-sectional view of some alternative embodiments of the IC of FIG. 9 in which the recessed gate electrode is varied.

With reference to FIG. 10, a cross-sectional view 1000 of some alternative embodiments of the IC of FIG. 9 is provided in which the first and second features 108a, 108b are protrusions that protrude upward and that have top surfaces that are flat or substantially flat. Further, the top surfaces of the protrusions are about even with a top surface of the gate dielectric layer 110. In alternative embodiments, the top surfaces of the protrusions may be elevated above or recessed below the top surface of the gate dielectric layer 110. In alternative embodiments, the recessed gate electrode 104 may be as in any one of FIGS. 1, 3, 4, 5A-5F, 6, 7A, 7B, and 8A-8C.

While FIGS. 2A and 2B are described with regard to the recessed gate electrode 104 of FIG. 1, it is to be appreciated that FIGS. 2A and 2B are applicable to the recessed gate electrode 104 in any one of FIGS. 6, 7A, 7B, 8A-8C, 9, and 10. For example, any one of FIGS. 6, 7A, 7B, 8A-8C, 9, and 10 may be taken along line A in either one of FIGS. 2A and 2B or along some other suitable line (not shown) in either one of FIGS. 2A and 2B. While FIGS. 7A and 7B are described with regard to the semiconductor device 102 of FIG. 6, it is to be appreciated that FIGS. 7A and 7B are applicable to the semiconductor device 102 in any one of FIGS. 8A-8C, 9, and 10. For example, any one of FIGS. 8A-8C, 9, and 10 may be taken along line B in either one of FIGS. 7A and 7B or along some other suitable line (not shown) in either one of FIGS. 7A and 7B.

With reference to FIGS. 11-24, a series of cross-sectional views 1100-2400 of some embodiments of a method for forming a semiconductor device comprising a recessed gate electrode that has high thickness uniformity is provided. The cross-sectional views 1100-2400 correspond to the cross-sectional view 400 of FIG. 4 and therefore illustrate formation of the IC and the semiconductor device 102 in FIG. 4. However, the method illustrated by the cross-sectional views 1100-2400 may also be employed to form the IC and/or the semiconductor device 102 in any of FIGS. 1, 3, 4, and 5A-5F.

Figure 11:
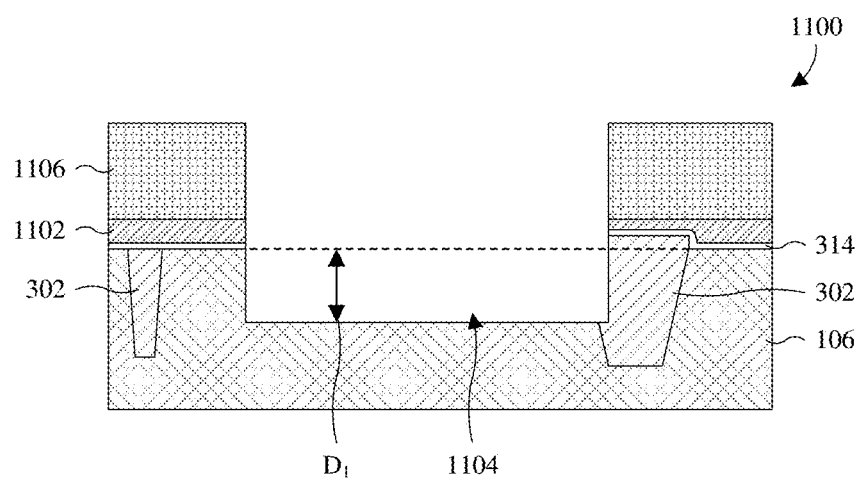
FIGS. 11-24 illustrate a series of cross-sectional views of some embodiments of a method for forming a semiconductor device comprising a recessed gate electrode that has high thickness uniformity.

As illustrated by the cross-sectional view 1100 of FIG. 11, a substrate 106 is provided. The substrate 106 is covered by a first base dielectric layer 314 and a second base dielectric layer 1102. Further, a trench isolation structure 302 extends into a top of the substrate 106 and is also covered by the first and second base dielectric layers 314, 1102. The second base dielectric layer 1102 may be or comprise, for example, silicon nitride and/or some other suitable dielectric(s). In some embodiments, the first base dielectric layer 314 is or comprise silicon oxide, whereas the second base dielectric layer 1102 is or comprise silicon nitride.

Also illustrated by the cross-sectional view 1100 of FIG. 11, the substrate 106 is patterned to form a recess 1104 extending into the substrate 106 to a depth $D_1$. The depth $D_1$ may, for example, be about 500-1500 angstroms, about 500-1000 angstroms, about 1000-1500 angstroms, about 1000 angstroms, or some other suitable value. The patterning may, for example, be performed by a photolithography/etching process or some other suitable process. The photolithography/etching process may, for example, employ a photoresist mask 1106 and/or some other suitable mask overlying the second base dielectric layer 1102.

Figure 12:
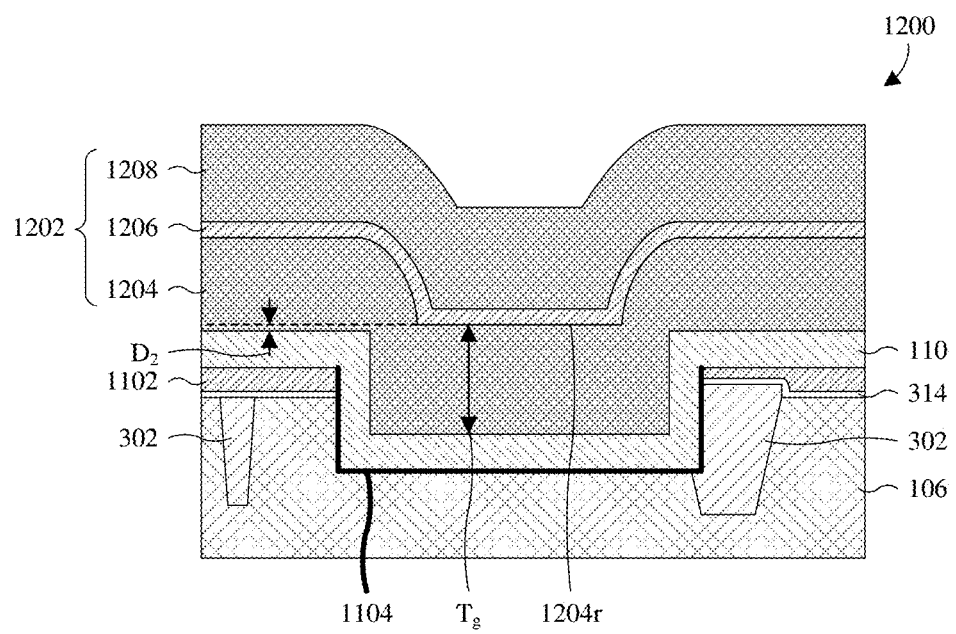

As illustrated by the cross-sectional view 1200 of FIG. 12, a gate dielectric layer 110 is deposited overlying the second base dielectric layer 1102 and lining the recess 1104. The gate dielectric layer 110 is recessed at the recess 1104 and may be or comprise, for example, silicon oxide and/or some other suitable dielectric(s).

Also illustrated by the cross-sectional view 1200 of FIG. 12, a multilayer film 1202 is deposited over the gate dielectric layer 110 and lining the recess 1104. The multilayer film 1202 comprises a gate electrode layer 1204, a first sacrificial layer 1206, and a second sacrificial layer 1208 each individually recessed at the recess 1104. The gate electrode layer 1204 is conductive and may be or comprise, for example, doped polysilicon, metal, some other suitable conductive material(s), or any combination of the foregoing. The first sacrificial layer 1206 overlies the gate electrode layer 1204 and may be or comprise, for example, silicon nitride, silicon oxide, silicon oxynitride, some other suitable dielectric(s), or any combination of the foregoing. The second sacrificial layer 1208 overlies the first sacrificial layer 1206 and is a different material than the first sacrificial layer 1206. The second sacrificial layer 1208 may be silicon oxide and/or some other suitable dielectric(s). Alternatively, the second sacrificial layer 1208 may be metal, doped polysilicon, some other suitable conductive material(s), or any combination of the foregoing. In some embodiments, the gate electrode layer 1204 and the second sacrificial layer 1208 are or comprise the same material. Further, in some embodiments, the gate electrode layer 1204 is or comprise doped polysilicon, the first sacrificial layer 1206 is or comprise silicon nitride, and the second sacrificial layer 1208 is or comprise silicon oxide.

In some embodiments, the gate dielectric layer 110 and the individual layers of the multilayer film 1202 are conformally deposited. Further, in some embodiments, the gate dielectric layer 110 and the individual layers of the multilayer film 1202 are deposited by chemical vapor deposition (CVD), physical vapor deposition (PVD), some other suitable deposition process(es), or any combination of the foregoing.

The gate electrode layer 1204 is deposited with a thickness $T_g$ that corresponds to a final thickness for a recessed gate electrode hereafter formed from the gate electrode layer 1204. Because CVD, PVD, and other suitable deposition processes may form the gate electrode layer 1204 with high thickness uniformity, the recessed gate electrode may have high thickness uniformity. The high thickness uniformity may lead to high uniformity with electrical properties of the recessed gate electrode and/or the semiconductor device when the semiconductor device is manufactured in bulk. For example, a resistance of the recessed gate electrode and/or a work function of the recessed gate electrode may have high uniformity, such that a threshold voltage of the semiconductor device may have high uniformity.

Further, the thickness $T_g$ is such that a recessed surface 1204r of the gate electrode layer 1204 is elevated above a top surface of the gate dielectric layer 110 by a distance D2. In alternative embodiments, embodiments, the thickness $T_g$ is such that the recessed surface 1204r of the gate electrode layer 1204 is about even with the top surface of the gate dielectric layer 110 (e.g., the distance D2 is about zero). As will be seen hereafter, variations in the thickness $T_g$ may lead to the recessed gate electrode having different profiles.

Figure 13:
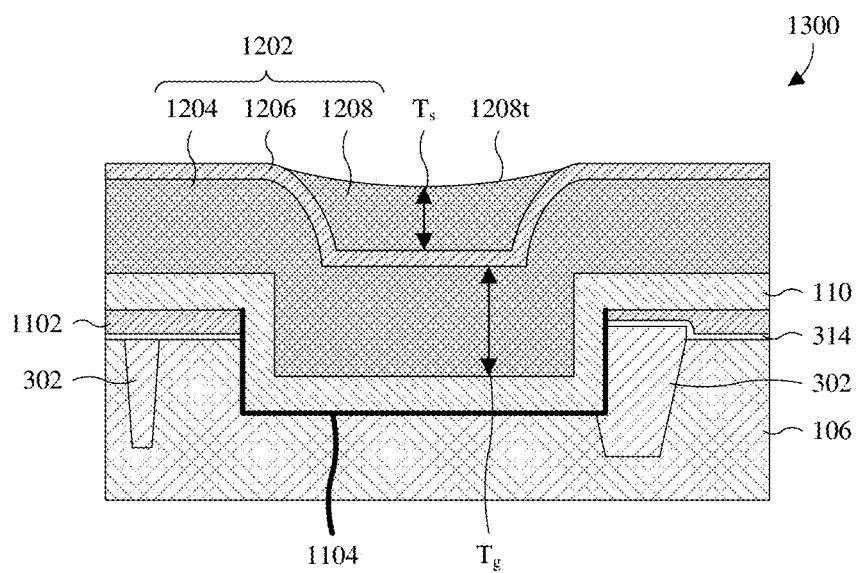

As illustrated by the cross-sectional view 1300 of FIG. 13, a first planarization is performed into the second sacrificial layer 1208 and stops on the first sacrificial layer 1206. The first planarization may, for example, be performed by a CMP and/or some other suitable planarization process. Because the first planarization stops on the first sacrificial layer 1206 and the first sacrificial layer 1206 is recessed at the recess 1104, the second sacrificial layer 1208 remains at the recess 1104. Further, in at least embodiments in which the first planarization is performed by a CMP, different CMP removal rates may lead to dishing at the second sacrificial layer 1208. As such, the top surface 1208t of the second sacrificial layer 1208 may be concave and/or a thickness T s of the second sacrificial layer 1208 may be non-uniform.

Figure 14:
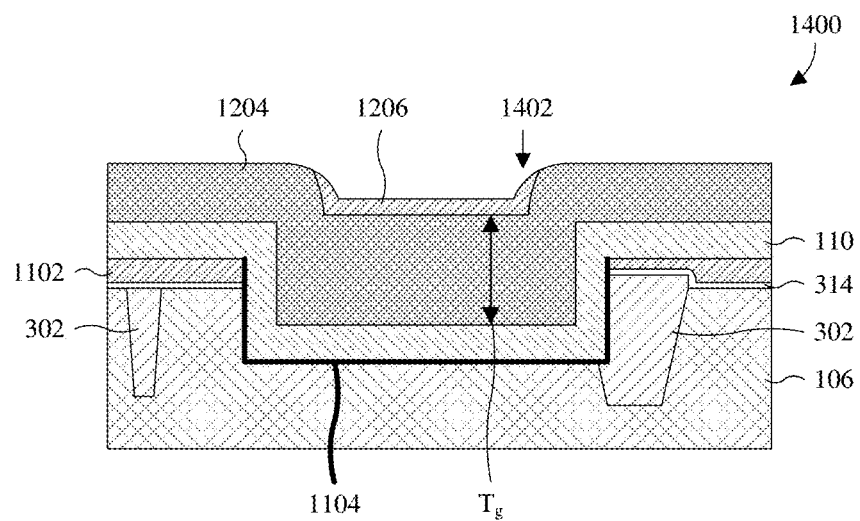

As illustrated by the cross-sectional view 1400 of FIG. 14, a first etch is performed into the multilayer film 1202. The first etch removes portions of the first sacrificial layer 1206 at sides of the recess 1104 and uncovered by the second sacrificial layer 1208 (see, e.g., FIG. 13). As a result, the first sacrificial layer 1206 has a pair of protrusions 1402 at a periphery of the first sacrificial layer 1206 and respectively on opposite sides of the first sacrificial layer 1206. Additionally, the first etch thins the gate electrode layer 1204 and removes the second sacrificial layer 1208 (see, e.g., FIG. 13). In alternative embodiments, the first etch doesn't remove the second sacrificial layer 1208 but instead thins the second sacrificial layer 1208. Regardless of whether the second sacrificial layer 1208 is removed or merely thinned by the first etch, the second sacrificial layer 1208 serves as a mask to protect underlying portions of the first sacrificial layer 1206. But for the second sacrificial layer 1208, the portion of the first sacrificial layer 1206 overlying the recess 1104 would be removed or substantially thinned.

In some embodiments, the first etch is performed with a non-selective etchant. The non-selective etchant may, for example, be non-selective in that it has the same or substantially the same etch rates for the first sacrificial layers 1206 as for the second sacrificial layer 1208 and/or the gate electrode layer 1204. In alternative embodiments, the first etch is performed with a selective etchant that has high selectivity (e.g., a high etch rate) for the first sacrificial layer 1206 relative to the second sacrificial layer 1208 and/or the gate electrode layer 1204. In some embodiments, the first etch is performed by dry etching. In alternative embodiments, the first etch is performed by wet etching and/or some other suitable type of etching.

Figure 15:
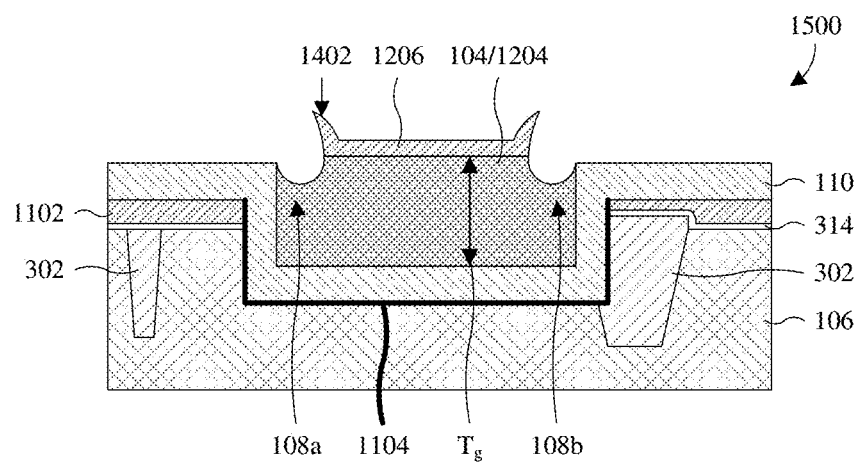

As illustrated by the cross-sectional view 1500 of FIG. 15, a second etch is performed into the gate electrode layer 1204 and stops on the first sacrificial layer 1206 and the gate dielectric layer 110. The second etch removes portions of the gate electrode layer 1204 at sides of the recess 1104 and uncovered by the first sacrificial layer 1206. As a result, the second etch forms a recessed gate electrode 104 in the recess 1104. Further, the second etch removes any remaining portion of the second sacrificial layer 1208 (see, e.g., FIG. 13).

The first sacrificial layer 1206 serves as a mask to protect underlying portions of the gate electrode layer 1204. Because the first sacrificial layer 1206 protects the gate electrode layer 1204 and the second etch stops on the first sacrificial layer 1206, the thickness $T_g$ of the recessed gate electrode 104 is the same thickness that the gate electrode layer 1204 (see, e.g., FIG. 12) was deposited as where the recessed gate electrode 104 is covered by the first sacrificial layer 1206. Because the gate electrode layer 1204 may be deposited with high thickness uniformity, the recessed gate electrode 104 may have high thickness uniformity. The high thickness uniformity may lead to high uniformity with electrical properties of the recessed gate electrode 104 when the recessed gate electrode 104 is manufactured in bulk.

Because the recessed gate electrode 104 is uncovered by the first sacrificial layer 1206 at a periphery of the recessed gate electrode 104, the second etch over etches into the recessed gate electrode 104 at the periphery of the recessed gate electrode 104. As a result, a first feature 108a and a second feature 108b may be formed at the periphery of the recessed gate electrode 104, respectively on opposite sides of the recessed gate electrode 104. A top layout of the recessed gate electrode 104 may, for example, be as in either one of FIGS. 2A and 2B and/or the cross-sectional view 1500 of FIG. 15 may, for example, be taken along line A in either one of FIGS. 2A and 2B. Other top layouts are, however, amenable.

The second etch is performed with a selective etchant that has a high etch rate for the gate electrode layer 1204 relative to the first sacrificial layer 1206 and/or the gate dielectric layer 110. In some embodiments, the second etch is performed by dry etching. In alternative embodiments, the second etch is performed by wet etching and/or some other suitable type of etching. However, dry etching may achieve higher selectivity than wet etching. Because of the higher selectivity, dry etching is less likely to etch through the first sacrificial layer 1206 at the recessed gate electrode 104 than wet etching. Hence, dry etching is less likely than wet etching to cause damage to the recessed gate electrode 104.

In some embodiments, the first and second etches are performed within a common process chamber, such that the substrate 106 remains in the common process chamber from a beginning of the first etch to an end of the second etch. In alternative embodiments, the first and second etches are performed in separate process chamber. In some embodiments, the first and second etches are performed by the same etch type. For example, the first and second etches may be performed by dry etching. In alternative embodiments, the first and second etches are performed by different etch types. For example, the first etch may be performed by wet etching, whereas the second etch may be performed by dry etching, or vice versa.

In some embodiments, the first and second etches are performed by dry etching within a common process chamber and define a common dry etch process. The common dry etch process may, for example, comprise performing the first etch with a first set of process gases in the common process chamber, transitioning from the first set of process gases to a second set of process gases in the common process chamber, and performing the second etch with the second set of process gases in the common process chamber.

Figure 16:
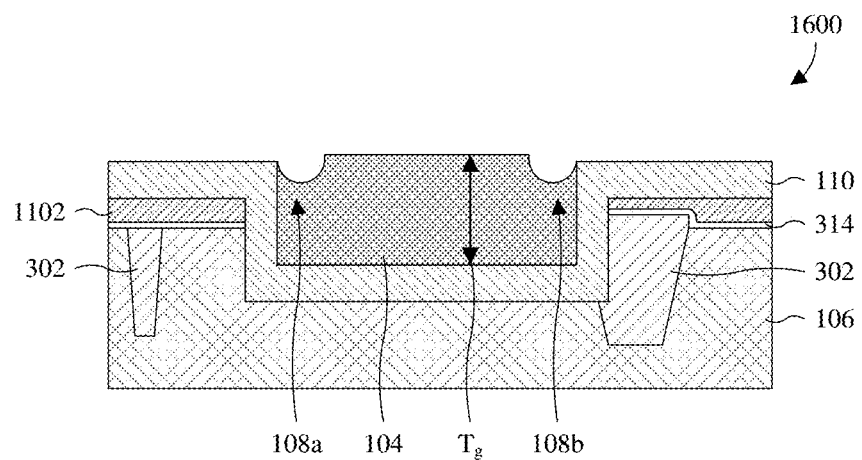

As illustrated by the cross-sectional view 1600 of FIG. 16, a third etch is performed into the first sacrificial layer 1206 (see, e.g., FIG. 15). The third etch removes the first sacrificial layer 1206. Further, in some embodiments, the third etch rounds corners of the recessed gate electrode 104 and/or rounds corners of the gate dielectric layer 110. The third etch is performed using an etchant having a high selectivity (e.g., a high etch rate) for the first sacrificial layer 1206 relative to the recessed gate electrode 104 so the recessed gate electrode 104 is not etched and/or is minimally etched.

In some embodiments, the third etch is performed by wet etching. For example, the third etch may be performed by wet etching using an etchant comprising phosphoric acid (e.g., $H_3PO_4$) in at least some embodiments in which the first sacrificial layer 1206 is or comprises silicon nitride. As another example, the third etch may be performed by wet etching using an etchant comprising dilute hydrofluoric acid (DHF) in at least some embodiments in which the first sacrificial layer 1206 is or comprises silicon oxide. Other suitable etchants are, however, amenable for the third etch. In alternative embodiments, the second etch process is performed by dry etching and/or some other suitable etching type. However, physical ion bombardment by dry etching is more likely to cause damage to the recessed gate electrode 104 than wet etching. Hence, dry etching is more likely to lead to non-uniformity in the thickness $T_g$ of the recessed gate electrode 104. As noted above, such non-uniformity in the thickness $T_g$ may lead to non-uniformity with electrical properties of the recessed gate electrode 104 when the recessed gate electrode 104 is manufactured in bulk.

Figure 17:
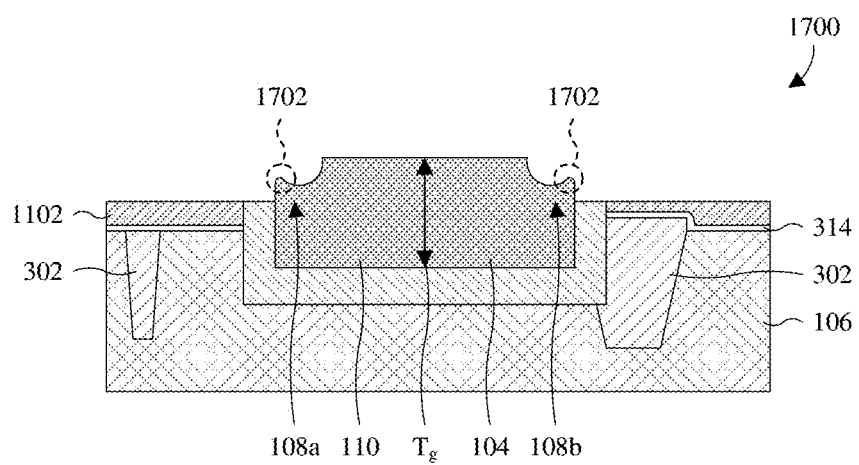

As illustrated by the cross-sectional view 1700 of FIG. 17, a fourth etch is performed into the gate dielectric layer 110. The fourth etch removes portions of the gate dielectric layer 110 overlying the second base dielectric layer 1102. Further, the fourth etch rounds corners 1702 of the recessed gate electrode 104 at the first and second features 108a, 108b. The fourth etch is performed using an etchant having a high selectivity (e.g., a high etch rate) for the gate dielectric layer 110 relative to the recessed gate electrode 104 so the recessed gate electrode 104 is not etched and/or is minimally etched.

In some embodiments, the fourth etch is performed by wet etching. For example, the fourth etch may be performed by wet etching using an etchant comprising DHF in at least some embodiments in which the gate dielectric layer 110 is or comprises silicon oxide. Other suitable etchants are, however, amenable for the fourth etch. In alternative embodiments, the fourth etch is performed by dry etching and/or some other suitable etching type. However, ion bombardment by dry etching is more likely than wet etching to cause damage to the recessed gate electrode 104.

In some embodiments, the gate dielectric layer 110 and the first sacrificial layer 1206 (see, e.g., FIG. 15) are or comprise the same material. For example, the gate dielectric layer 110 and the first sacrificial layer 1206 may be or comprise silicon oxide. In at least some embodiments in which the gate dielectric layer 110 and the first sacrificial layer 1206 are or comprise the same material, the third and fourth etches are performed together by the same act of etching. For example, the third and fourth etches may be performed together by wet etching using DHF in at least some embodiments in which the gate dielectric layer 110 and the first sacrificial layer 1206 are or comprise silicon oxide. Accordingly, the gate dielectric layer 110 and the first sacrificial layer 1206 are removed simultaneously in some embodiments.

Figure 18:
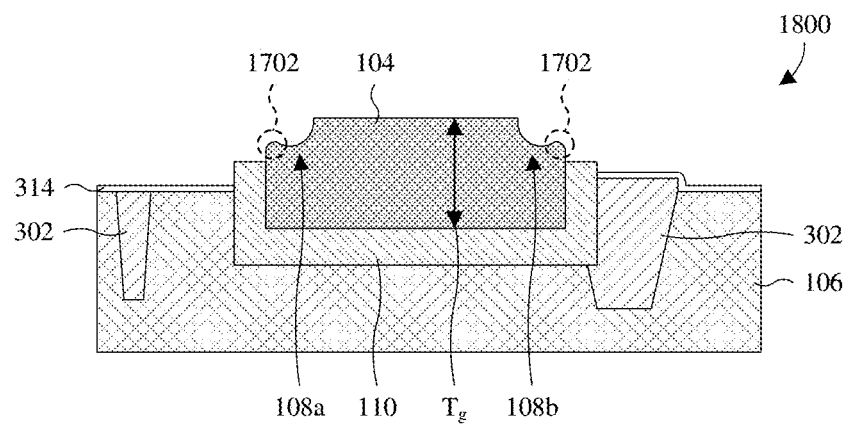

As illustrated by the cross-sectional view 1800 of FIG. 18, a fifth etch is performed into the second base dielectric layer 1102. The fifth etch removes the second base dielectric layer 1102. Further, the fifth etch further rounds the corners 1702 of the recessed gate electrode 104 at the first and second features 108a, 108b. The fifth etch is performed using an etchant having a high selectivity (e.g., a high etch rate) for the second base dielectric layer 1102 relative to the recessed gate electrode 104 so the recessed gate electrode 104 is not etched and/or is minimally etched.

In some embodiments, the fifth etch is performed by wet etching. For example, the fifth etch may be performed by wet etching using an etchant comprising phosphoric acid (e.g., $H_3PO_4$) in at least some embodiments in which the second base dielectric layer 1102 is or comprises silicon nitride. Other suitable etchants are, however, amenable for the fifth etch. In alternative embodiments, the fifth etch is performed by dry etching and/or some other suitable etching type. However, ion bombardment by dry etching is more likely than wet etching to cause damage to the recessed gate electrode 104.

In some embodiments, the first and second etches are performed by dry etching and/or define a multi-step dry etch process, whereas the third, fourth, and fifth etches are performed by wet etching and/or define a multi-step wet etch process. In some embodiments, the second base dielectric layer 1102 (see, e.g., FIG. 17) and the first sacrificial layer 1206 (see, e.g., FIG. 15) are or comprise silicon nitride, whereas the gate dielectric layer 110 is or comprises silicon oxide. In at least some of such embodiments, the third and fifth etches are performed by wet etching using etchants comprising phosphoric acid, whereas the fourth etch is performed by wet etching using an etchant comprising DHF.

Figure 19:
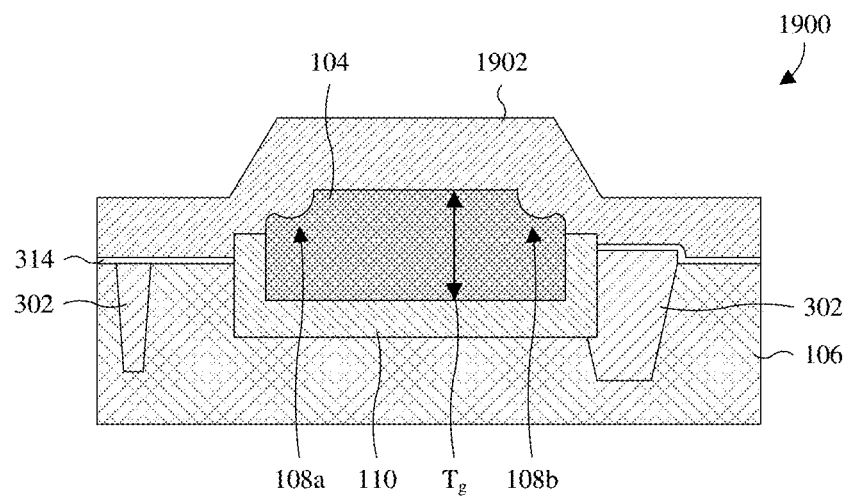

As illustrated by the cross-sectional view 1900 of FIG. 19, a hard mask layer 1902 is deposited over recessed gate electrode 104 and the substrate 106. The hard mask layer 1902 may be or comprise, for example, silicon nitride, silicon oxide, some other suitable dielectric(s), or any combination of the foregoing.

Figure 20:
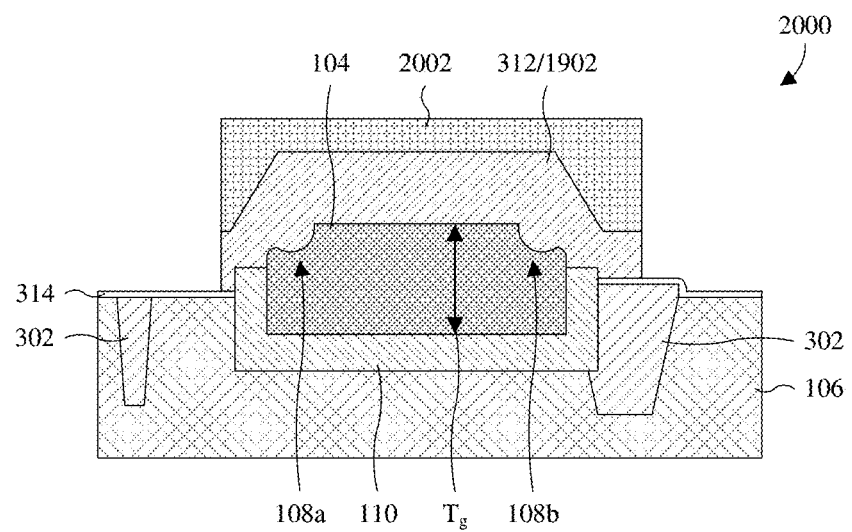

As illustrated by the cross-sectional view 2000 of FIG. 20, the hard mask layer 1902 (see, e.g., FIG. 19) is patterned to remove the hard mask layer 1902 from sides of the recessed gate electrode 104 and to form a hard mask 312 overlying the recessed gate electrode 104. The patterning may, for example, be performed by a photolithography/etching or some other suitable patterning process. The photolithography/etching process may, for example, employ a photoresist mask 2002 and/or some other suitable mask overlying the hard mask layer 1902.

Figure 21:
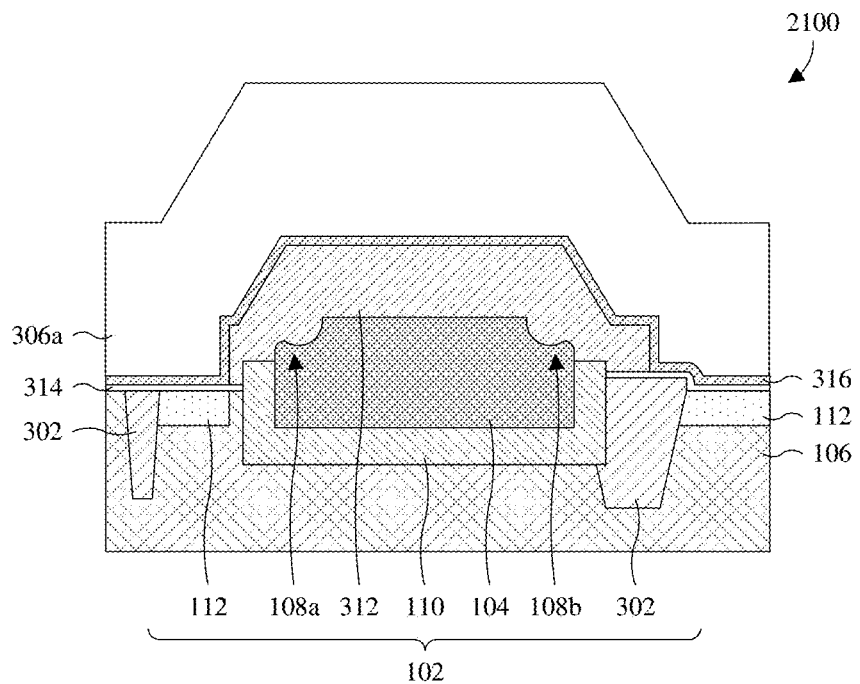

As illustrated by the cross-sectional view 2100 of FIG. 21, a pair of source/drain regions 112 are formed in the substrate 106. The source/drain regions 112 are formed respectively on opposite sides of the recessed gate electrode 104. The source/drain regions 112 may, for example, be formed by ion implantation into the substrate 106, an epitaxial deposition process, some other suitable process, or any combination of the foregoing. The recessed gate electrode 104, the gate dielectric layer 110, and the source/drain regions 112 partially or wholly define a semiconductor device 102. The semiconductor device 102 may be, for example, a FET, some other suitable transistor, a memory cell, or some other suitable semiconductor device.

Also illustrated by the cross-sectional view 2100 of FIG. 21, a CESL 316 and a first ILD layer 306a are deposited over the hard mask 312 and the substrate 106. The first ILD Layer 306a may, for example, be or comprise silicon oxide and/or some other suitable dielectric(s).

Figure 22:
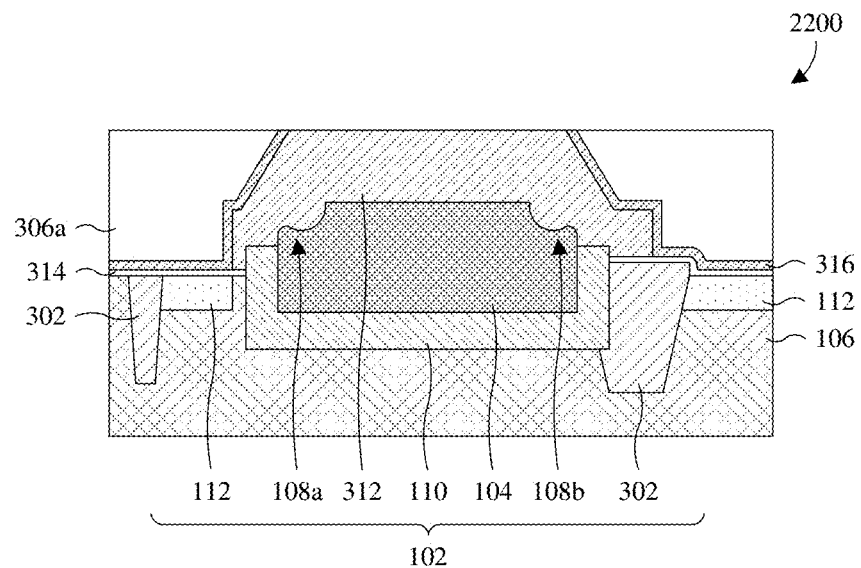

As illustrated by the cross-sectional view 2200 of FIG. 22, a second planarization is performed into the first ILD layer 306a and the CESL 316 to expose the hard mask 312. Further, the second planarization coplanarize a top surface of the first ILD layer 306a and a top surface of the CESL 316 with a top surface of the hard mask 312. The second planarization may, for example, be performed by a CMP and/or some other suitable planarization process.

Figure 23:
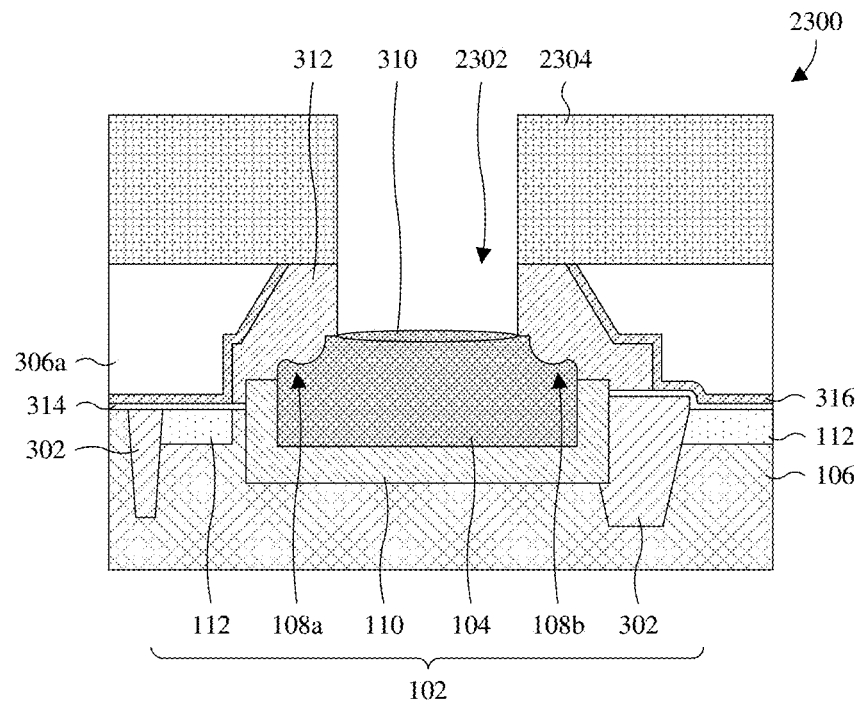

As illustrated by the cross-sectional view 2300 of FIG. 23, the hard mask 312 is patterned to form an opening 2302 exposing the recessed gate electrode 104. The patterning may, for example, be performed by a photolithography/ etching or some other suitable patterning process. The photolithography/etching process may, for example, employ a photoresist mask 2304 and/or some other suitable mask overlying the hard mask 312.

Also illustrated by the cross-sectional view 2300 of FIG. 23, a silicide layer 310 is formed on the recessed gate electrode 104, in the opening 2302. The silicide layer 310 may, for example, be formed by a salicide process and/or some other suitable silicide formation process.

Figure 24:
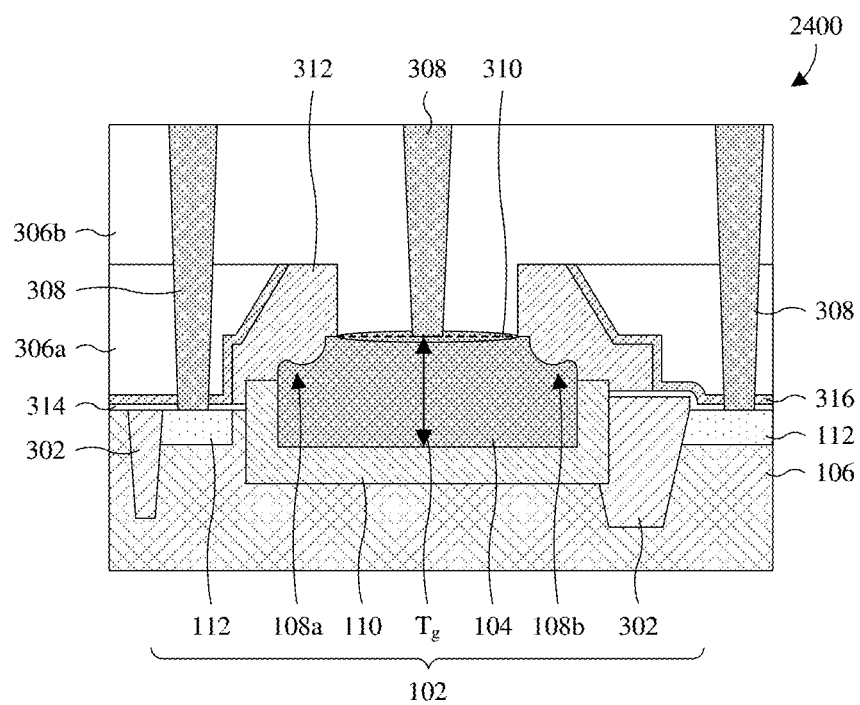

As illustrated by the cross-sectional view 2400 of FIG. 24, a second ILD layer 306b is formed filling the opening 2302 (see, e.g., FIG. 23) and further overlying the first ILD layer 306a and the silicide layer 310. The second ILD layer 306b may, for example, be or comprise silicon oxide and/or some other suitable dielectric(s). A process for forming the second ILD layer 306b may, for example, comprise depositing the second ILD layer 306b and subsequently performing a planarization into a top surface of the second ILD layer 306b.

Also illustrated by the cross-sectional view 2400 of FIG. 24, contact vias 308 are formed in the second ILD layer 306b, extending respectively from the source/drain regions 112 and the silicide layer 310. A process for forming the contact vias 308 may, for example, comprise selectively etching the first and second ILD layers 306a, 306b to form contact openings, depositing conductive material in the contact openings, and planarizing the conductive material. Other processes are, however, amenable.

Because the recessed gate electrode 104 is formed according to the method of the present disclosure, the thickness $T_g$ of the recessed gate electrode 104 has high uniformity and the recessed gate electrode 104 is less likely to be too thin at a center of the recessed gate electrode 104. If the recessed gate electrode 104 were to get too thin at the center of the recessed gate electrode 104, formation of the contact vias 308 may over etch through the recessed gate electrode 104 and damage the gate dielectric layer 110. Such damage may degrade performance of the semiconductor device 102 and/or lead to failure of the semiconductor device 102.

While FIGS. 11-24 are described with reference to various embodiments of a method, it will be appreciated that the structures shown in FIGS. 11-24 are not limited to the method but rather may stand alone separate of the method. While FIGS. 11-24 are described as a series of acts, it will be appreciated that the order of the acts may be altered in other embodiments. While FIGS. 11-24 illustrate and describe as a specific set of acts, some acts that are illustrated and/or described may be omitted in other embodiments. Further, acts that are not illustrated and/or described may be included in other embodiments.

With reference to FIGS. 25-29, a series of cross-sectional views 2500-2900 of some alternative embodiments of the method of FIGS. 11-24 is provided in which a gate electrode layer has a recessed surface recessed relative to a top surface of a gate oxide layer. The cross-sectional views 2500-2900 correspond to the cross-sectional view 500B of FIG. 5B and therefore illustrate formation of the IC and the semiconductor device 102 in FIG. 5B. However, the method illustrated by the cross-sectional views 2500-2900 may also be employed to form the IC and/or the semiconductor device 102 in any of FIGS. 1, 3, 4, and 5A-5F.

Figure 25:
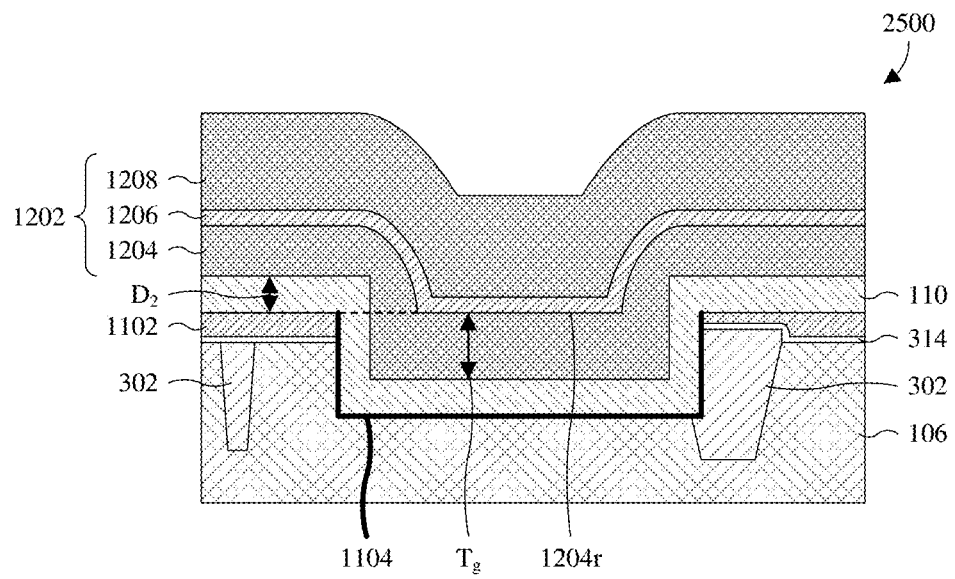
FIGS. 25-29 illustrate a series of cross-sectional views of some alternative embodiments of the method of FIGS. 11-24 in which a gate electrode layer has a recessed surface recessed relative to a top surface of a gate dielectric layer.

As illustrated by the cross-sectional view 2500 of FIG. 25, the recess 1104 is formed in the substrate 106. Further, the gate dielectric layer 110 and the multilayer film 1202 are deposited lining the recess 1104. The recess 1104, the gate dielectric layer 110, and the multilayer film 1202 are formed as illustrated and described respectively with regard to FIGS. 11 and 12, except that the recessed surface 1204r of the gate electrode layer 1204 is recessed below the top surface of the gate dielectric layer 110 by the distance D2.

Figure 26:
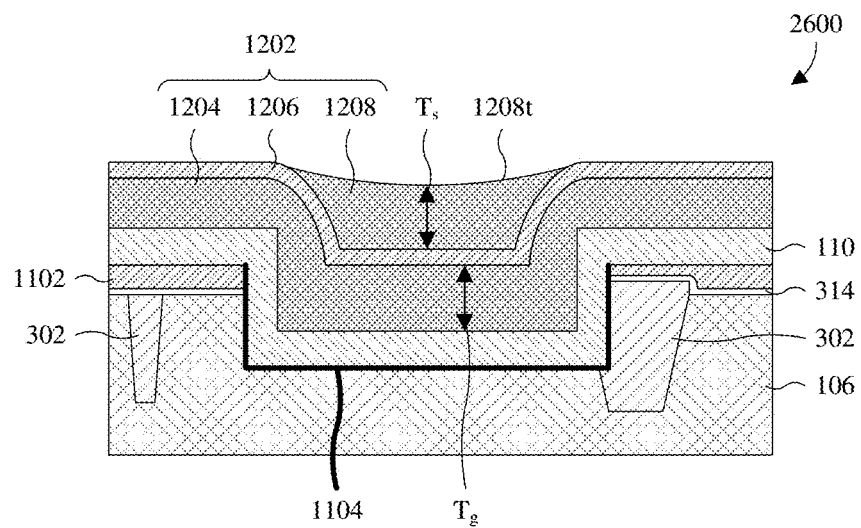

As illustrated by the cross-sectional view 2600 of FIG. 26, the first planarization is performed into the second sacrificial layer 1208 as described with regard to FIG. 13.

Figure 27:
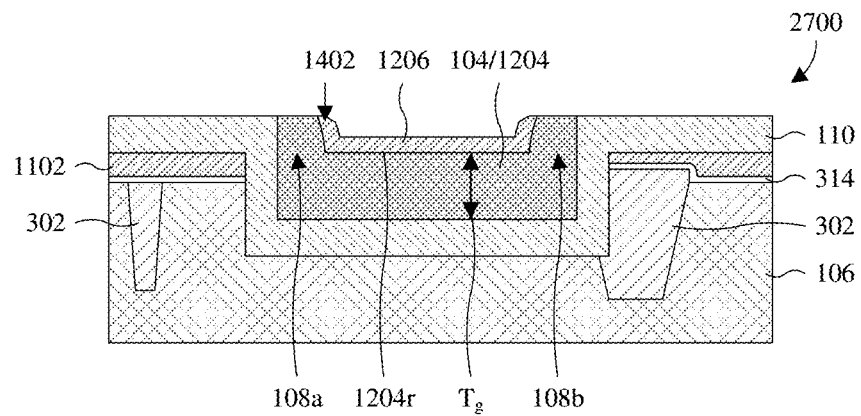

As illustrated by the cross-sectional view 2700 of FIG. 27, the first and second etches are performed respectively as described with regard to FIGS. 14 and 15 to form the recessed gate electrode 104. Because the recessed surface 1204r of the gate electrode layer 1204 is recessed below the top surface of the gate dielectric layer 110, the first and second features 108a, 108b are protrusions that protrude upward and that have top surfaces that are flat or substantially flat. In alternative embodiments, the top surfaces are curved and/or have some other suitable profile.

Figure 28:
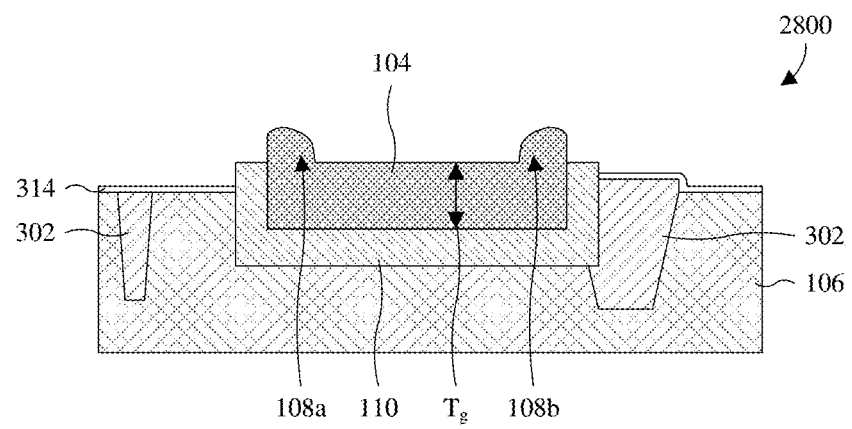

As illustrated by the cross-sectional view 2800 of FIG. 28, the third, fourth, and fifth etches are performed to respectively remove: 1) the first sacrificial layer 1206 (see, e.g., FIG. 27); 2) the gate dielectric layer 110 at sides of the recessed gate electrode 104; and 3) the second base dielectric layer 1102 (see, e.g., FIG. 27). The third, fourth, and fifth etches may, for example, be performed as described respectively with regard to FIGS. 16-18. As discussed above, in at least some embodiments in which the gate dielectric layer 110 and the first sacrificial layer 1206 are or comprise the same material, the third and fourth etches are performed together by the same act of etching. Accordingly, in some embodiments, the gate dielectric layer 110 and the first sacrificial layer 1206 are removed simultaneously.

Figure 29:
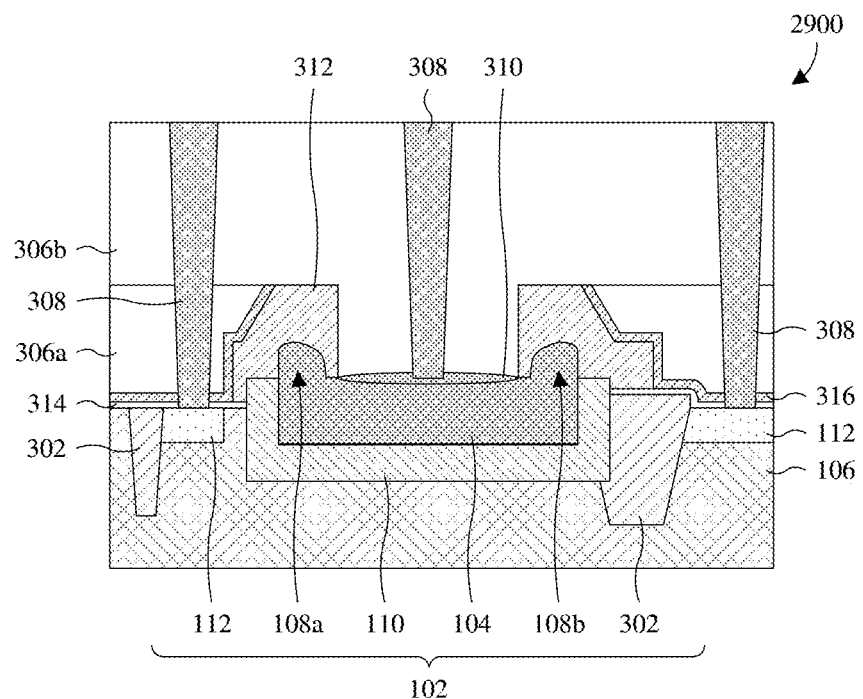

As illustrated by the cross-sectional view 2900 of FIG. 29, the first and second ILD layers 306a, 306b, the CESL 316, the silicide layer 310, the source/drain regions 112, the contact vias 308, and the hard mask 312 are formed as described with regard to FIGS. 19-24.

While FIGS. 25-29 are described with reference to various embodiments of a method, it will be appreciated that the structures shown in FIGS. 25-29 are not limited to the method but rather may stand alone separate of the method. While FIGS. 25-29 are described as a series of acts, it will be appreciated that the order of the acts may be altered in other embodiments. While FIGS. 25-29 illustrate and describe as a specific set of acts, some acts that are illustrated and/or described may be omitted in other embodiments. Further, acts that are not illustrated and/or described may be included in other embodiments.

With reference to FIGS. 30-34, a series of cross-sectional views 3000-3400 of some alternative embodiments of the method of FIGS. 11-24 is provided in which a gate electrode layer has a recessed surface elevated above a top surface of a gate dielectric layer by a greater amount. The cross-sectional views 3000-3400 correspond to the cross-sectional view 500A of FIG. 5A and therefore illustrate formation of the IC and the semiconductor device 102 in FIG. 5A. However, the method illustrated by the cross-sectional views 3000-3400 may also be employed to form the IC and/or the semiconductor device 102 in any of FIGS. 1, 3, 4, and 5A-5F.

Figure 30:
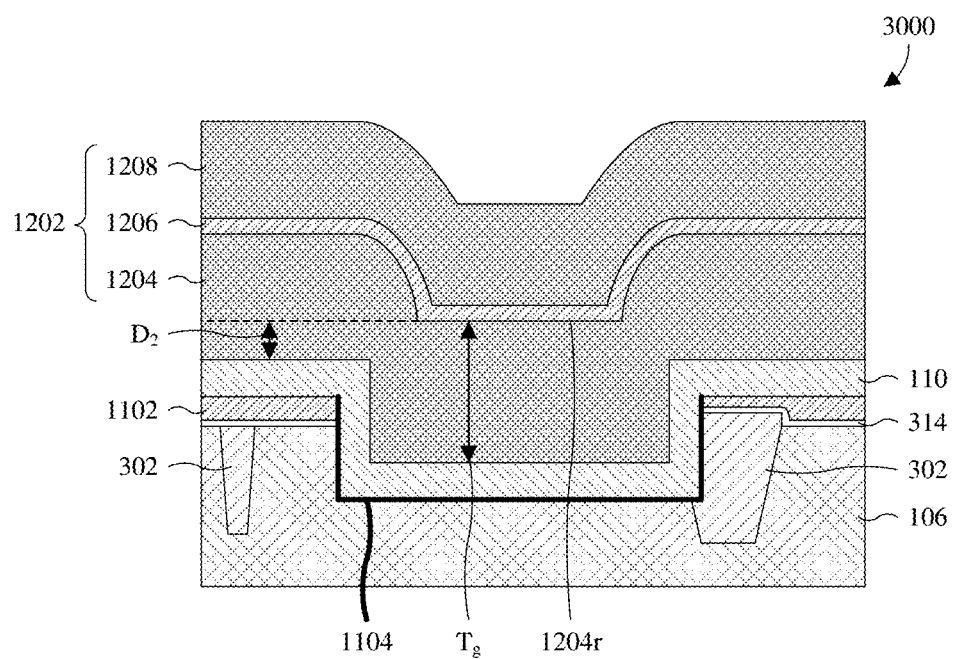
FIGS. 30-34 illustrate a series of cross-sectional views of some alternative embodiments of the method of FIGS. 11-24 in which a gate electrode layer has a recessed surface elevated above a top surface of a gate dielectric layer by a greater amount.

As illustrated by the cross-sectional view 3000 of FIG. 30, the recess 1104 is formed in the substrate 106. Further, the gate dielectric layer 110 and the multilayer film 1202 are deposited lining the recess 1104. The recess 1104, the gate dielectric layer 110, and the multilayer film 1202 are formed as illustrated and described respectively with regard to FIGS. 11 and 12, except that the thickness $T_g$ of the gate electrode layer 1204 is greater than in FIG. 12.

Figure 31:
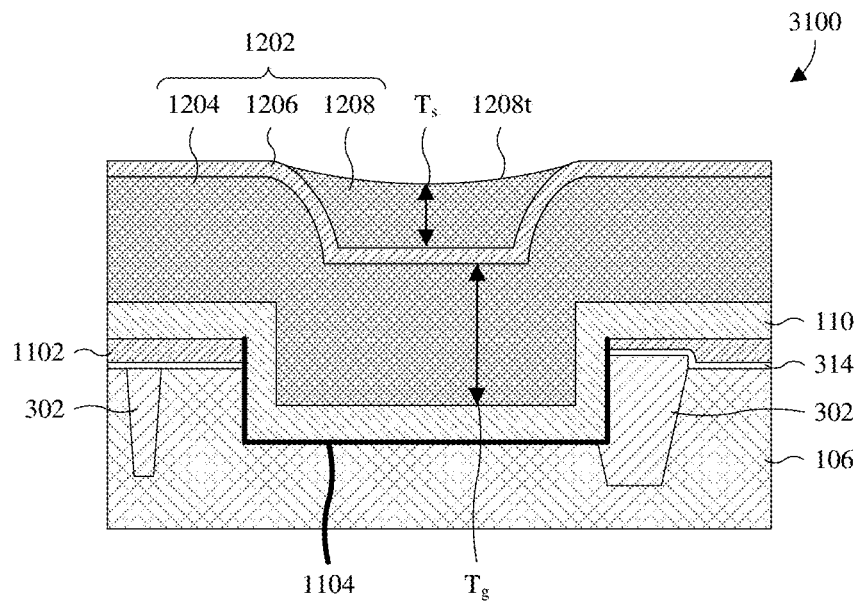

As illustrated by the cross-sectional view 3100 of FIG. 31, the first planarization is performed into the second sacrificial layer 1208 as described with regard to FIG. 13.

Figure 32:
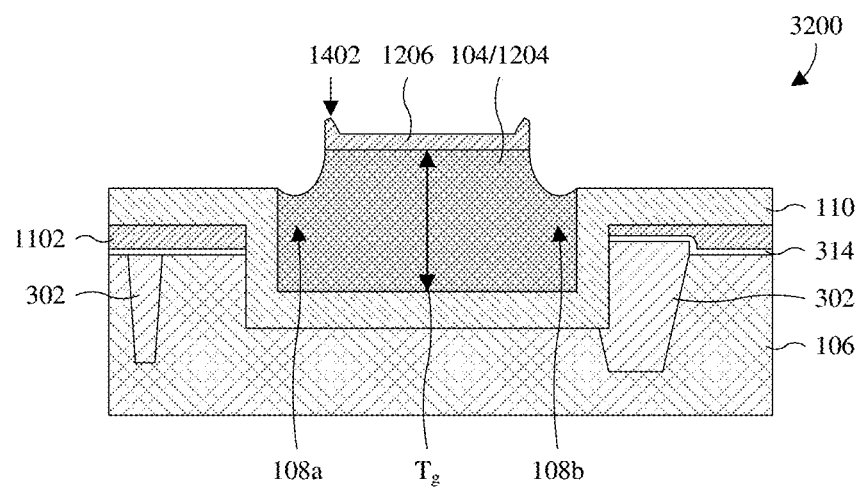

As illustrated by the cross-sectional view 3200 of FIG. 32, the first and second etches are performed respectively as described with regard to FIGS. 14 and 15 to form the recessed gate electrode 104. Because the thickness $T_g$ of the gate electrode layer 1204 is greater than in FIG. 15, the first and second features 108a, 108b are more asymmetric than in FIG. 15.

Figure 33:
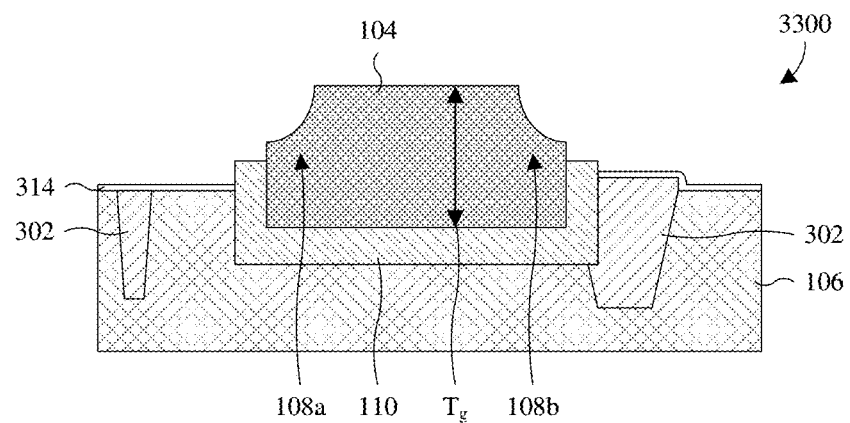

As illustrated by the cross-sectional view 3300 of FIG. 33, the third, fourth, and fifth etches are performed to respectively remove: 1) the first sacrificial layer 1206 (see, e.g., FIG. 32); 2) the gate dielectric layer 110 at sides of the recessed gate electrode 104; and 3) the second base dielectric layer 1102 (see, e.g., FIG. 32). The third, fourth, and fifth etches may, for example, be performed as described respectively with regard to FIGS. 16-18. As discussed above, in at least some embodiments in which the gate dielectric layer 110 and the first sacrificial layer 1206 are or comprise the same material, the third and fourth etches are performed together by the same act of etching. Accordingly, in some embodiments, the gate dielectric layer 110 and the first sacrificial layer 1206 are removed simultaneously.

Figure 34:
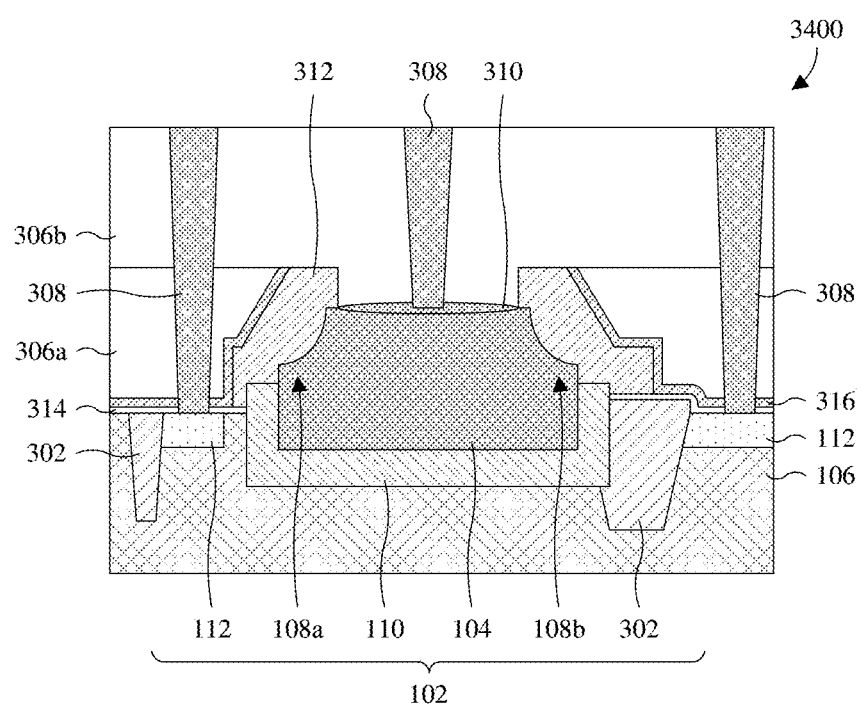

As illustrated by the cross-sectional view 3400 of FIG. 34, the first and second ILD layers 306a, 306b, the CESL 316, the silicide layer 310, the source/drain regions 112, the contact vias 308, and the hard mask 312 are formed as described with regard to FIGS. 19-24.

While FIGS. 30-34 are described with reference to various embodiments of a method, it will be appreciated that the structures shown in FIGS. 30-34 are not limited to the method but rather may stand alone separate of the method. While FIGS. 30-34 are described as a series of acts, it will be appreciated that the order of the acts may be altered in other embodiments. While FIGS. 30-34 illustrate and describe as a specific set of acts, some acts that are illustrated and/or described may be omitted in other embodiments. Further, acts that are not illustrated and/or described may be included in other embodiments.

Figure 35:
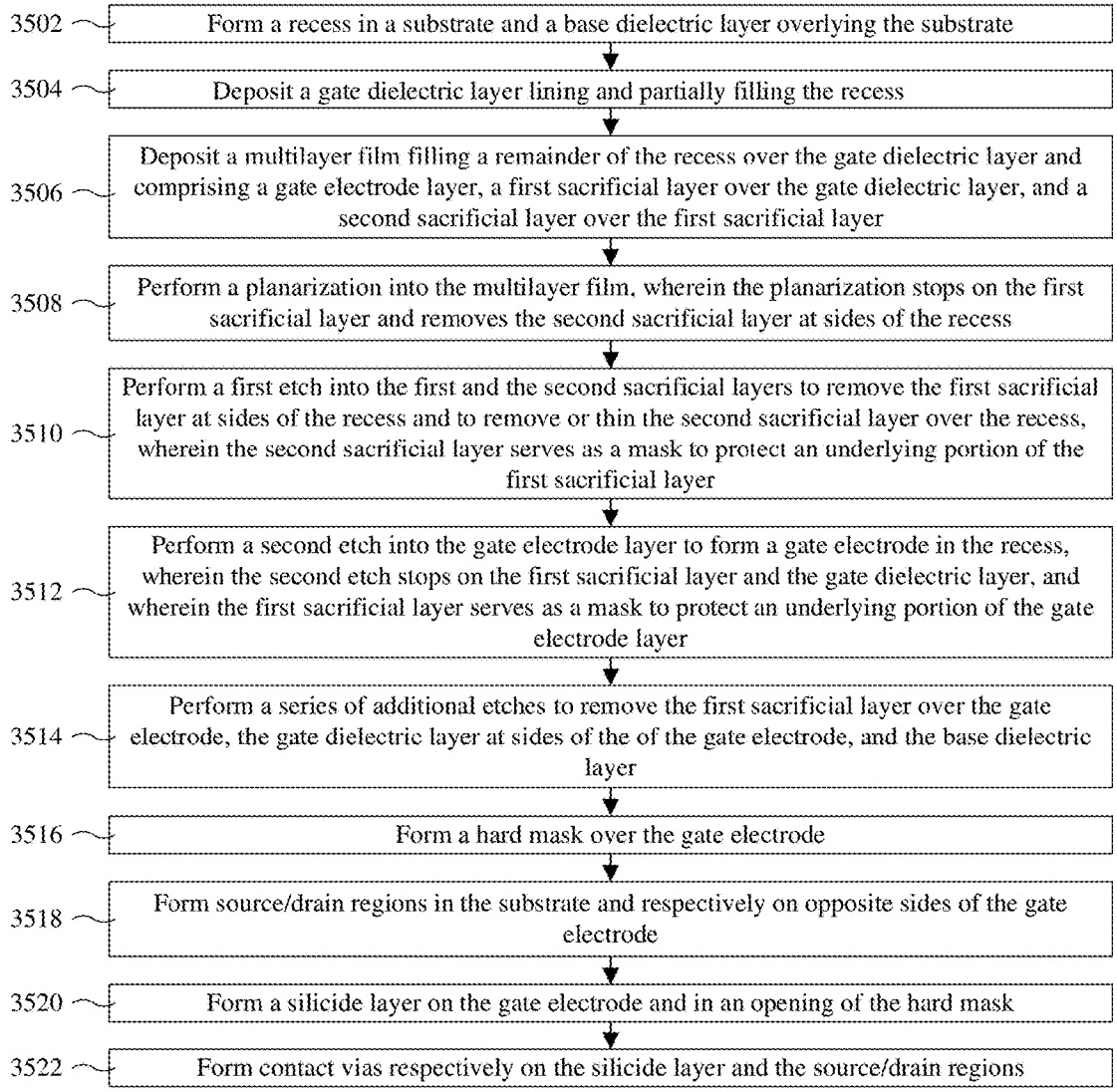
FIG. 35 illustrates a block diagram of some embodiments of the method of FIGS. 11-34.

With reference to FIG. 35, a block diagram 3500 of some embodiments of the method of FIGS. 11-34 is provided.

At 3502, a recess is formed in a substrate and a base dielectric layer. See, for example, FIG. 11, 25, or 30.

At 3504, a gate dielectric layer is deposited lining and partially filling the recess. See, for example, FIG. 12, 25, or 30.

At 3506, a multilayer film is deposited filling a remainder of the recess over the gate dielectric layer and comprising a gate electrode layer, a first sacrificial layer over the gate dielectric layer, and a second sacrificial layer over the first sacrificial layer. See, for example, FIG. 12, 25, or 30.

At 3508, a planarization is performed into the second sacrificial layer, wherein the planarization stops on the first sacrificial layer and removes the second sacrificial layer at sides of the recess. See, for example, FIG. 13, 26, or 31.

At 3510, a first etch is performed into the first and the second sacrificial layers to remove the first sacrificial layer at sides of the recess and to remove or thin the second sacrificial layer over the recess, wherein the second sacrificial layer serves as a mask to protect an underlying portion of the first sacrificial layer. See, for example, FIG. 14, 27, or 32.

At 3512, a second etch is performed into the gate electrode layer to form a gate electrode in the recess, wherein the second etch stops on the first sacrificial layer and the gate dielectric layer, and wherein the first sacrificial layer serves as a mask to protect an underlying portion of the gate electrode layer. See, for example, FIG. 15, 27, or 32. In some embodiments, the first etch and/or the second etch is/are performed by dry etching. In some embodiments, the first and second etches are performed by a common dry etching process in a common process chamber.

At 3514, a series of additional etches is performed to remove the first sacrificial layer over the gate electrode, the gate dielectric layer at sides of the of the gate electrode, and the base dielectric layer. See, for example, FIGS. 16-18, FIG. 28, or FIG. 33. In some embodiments, the series of etches is performed by wet etching.

At 3516, a hard mask is formed over the gate electrode. See, for example, FIGS. 19 and 20, FIG. 29, or FIG. 34.

At 3518, source/drain regions are formed in the substrate and respectively on opposite sides of the gate electrode. See, for example, FIG. 21, 29, or 34.

At 3520, a silicide layer is formed on the gate electrode and in an opening of the hard mask. See, for example, FIGS. 21-23, FIG. 29, or FIG. 34.

At 3522, contact vias are formed respectively on the silicide layer and the source/drain regions. See, for example, FIG. 24, 29, or 34.

While the block diagram 3500 of FIG. 35 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 36-43, a series of cross-sectional views 3600-4300 of some alternative embodiments of the method of FIGS. 11-24 is provided in which the recessed gate electrode is formed in place of a dummy structure. The cross-sectional views 3600-4300 correspond to the cross-sectional view 600 of FIG. 6 and therefore illustrate formation of the IC and the semiconductor device 102 in FIG. 6. However, the method illustrated by the cross-sectional views 3600-4300 may also be employed to form the IC and/or the semiconductor device 102 in any of FIGS. 7A, 7B, 8A-8C, 9, and 10.

Figure 36:
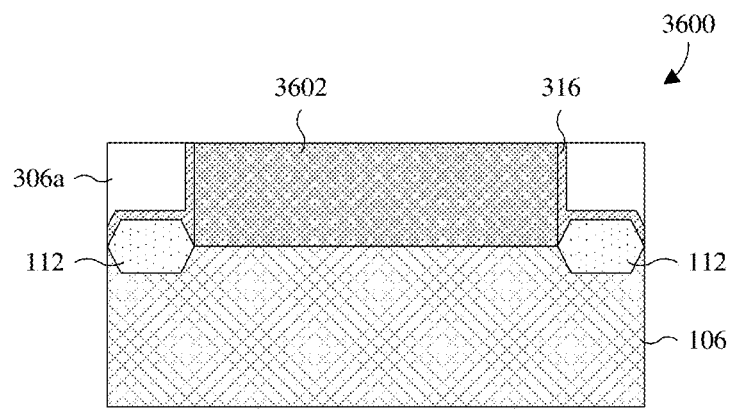
FIGS. 36-43 illustrate a series of cross-sectional views of some alternative embodiments of the method of FIGS. 11-24 in which the recessed gate electrode is formed in place of a dummy structure.

As illustrated by the cross-sectional view 3600 of FIG. 36, a substrate 106 is provided. The substrate 106 underlies and supports a pair of source/drain regions 112, a dummy structure 3602, a CESL 316, and a first ILD layer 306a. The dummy structure 3602 is laterally between the source/drain regions 112 and is laterally surrounded by the CESL 316 and the first ILD layer 306a. The first ILD layer 306a overlies the source/drain regions 112 and is separated from the source/drain regions 112 by the CESL 316.

Figure 37:
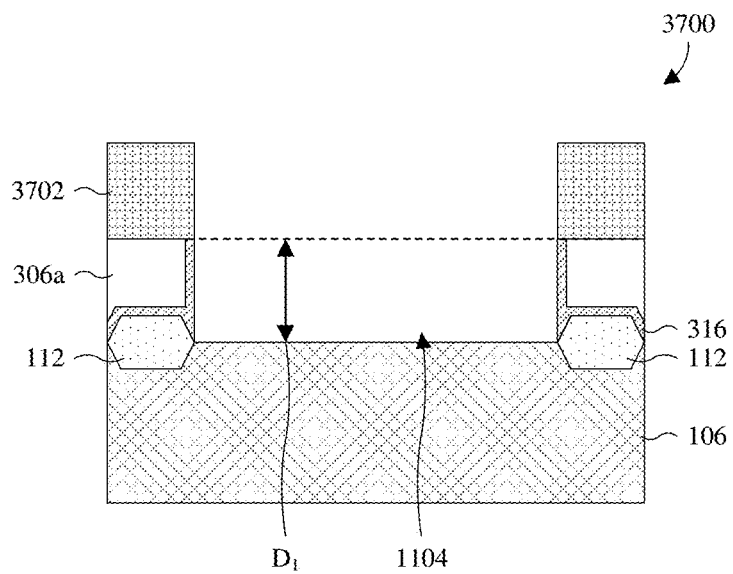

As illustrated by the cross-sectional view 3700 of FIG. 37, the dummy structure 3602 (see, e.g., FIG. 36) is removed to expose or otherwise form a recess 1104 having a depth $D_1$. The depth $D_1$ may, for example, be about 500-1500 angstroms, about 500-1000 angstroms, about 1000-1500 angstroms, about 1000 angstroms, or some other suitable value. The removal may, for example, be performed by a photolithography/etching process or some other suitable process. The photolithography/etching process may, for example, employ a photoresist mask 3702 and/or some other suitable mask overlying the first ILD layer 306a.

Figure 38:
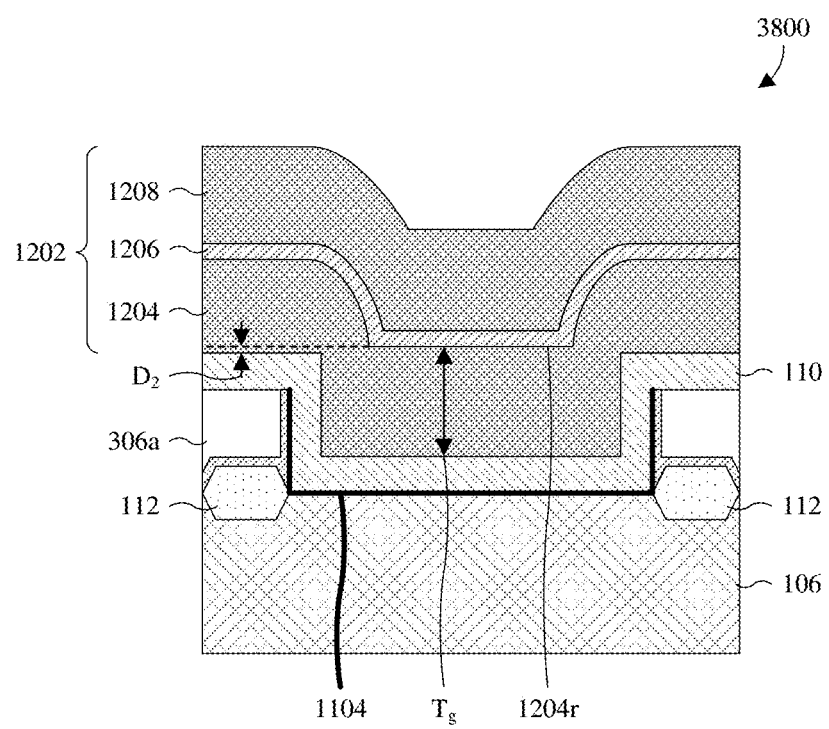

As illustrated by the cross-sectional view 3800 of FIG. 38, the gate dielectric layer 110 and the multilayer film 1202 are deposited lining the recess 1104. The gate dielectric layer 110 and the multilayer film 1202 are formed as illustrated and described with regard to FIG. 12.

Figure 39:
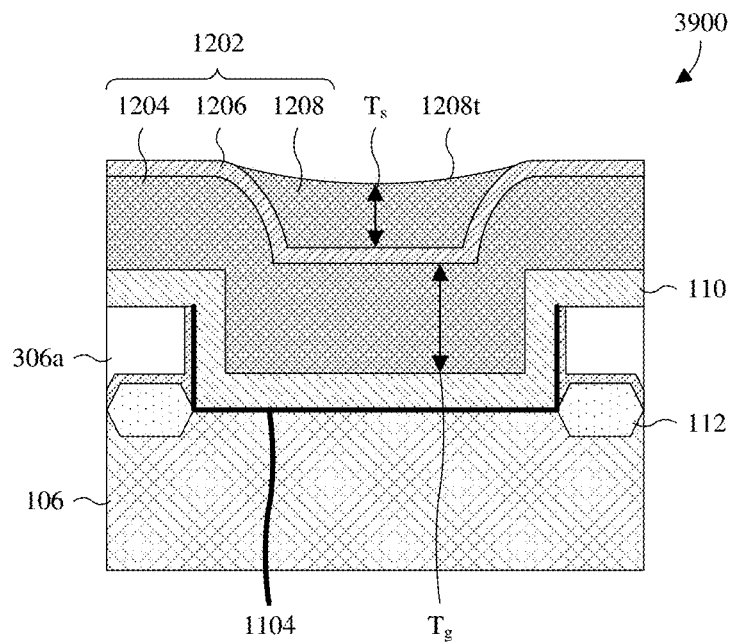

As illustrated by the cross-sectional view 3900 of FIG. 39, the first planarization is performed into the second sacrificial layer 1208 as described with regard to FIG. 13.

Figure 40:
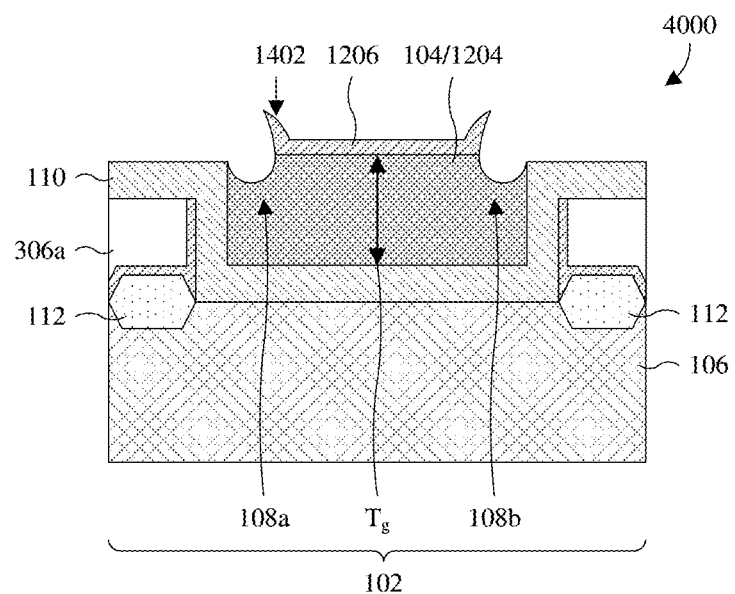

As illustrated by the cross-sectional view 4000 of FIG. 40, the first and second etches are performed into the multilayer film 1202 (see, e.g., FIG. 39) to form the recessed gate electrode 104 as described with regard to FIGS. 14 and 15.

Figure 41:
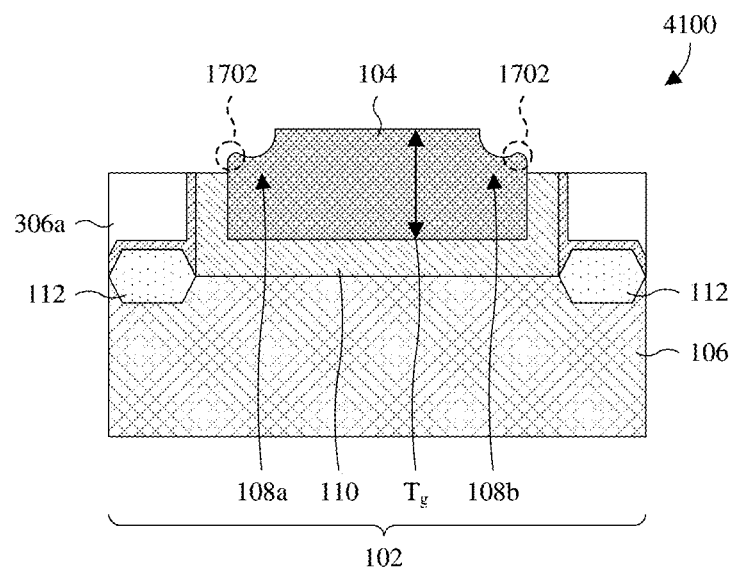

As illustrated by the cross-sectional view 4100 of FIG. 41, the third and fourth etches are performed to remove: 1) the first sacrificial layer 1206 (see, e.g., FIG. 40); and 2) the gate dielectric layer 110 at sides of the recessed gate electrode 104. The third and fourth etches may, for example, be performed as described with regard to FIGS. 16 and 17.

Figure 42:
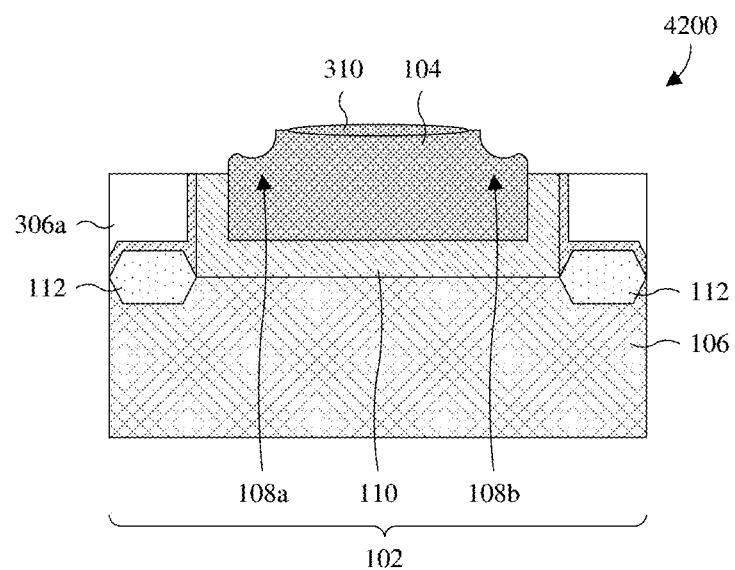

As illustrated by the cross-sectional view 4200 of FIG. 42, the silicide layer 310 is formed on the recessed gate electrode 104. The silicide layer 310 may, for example, be formed by a salicide process and/or some other suitable silicide formation process.

Figure 43:
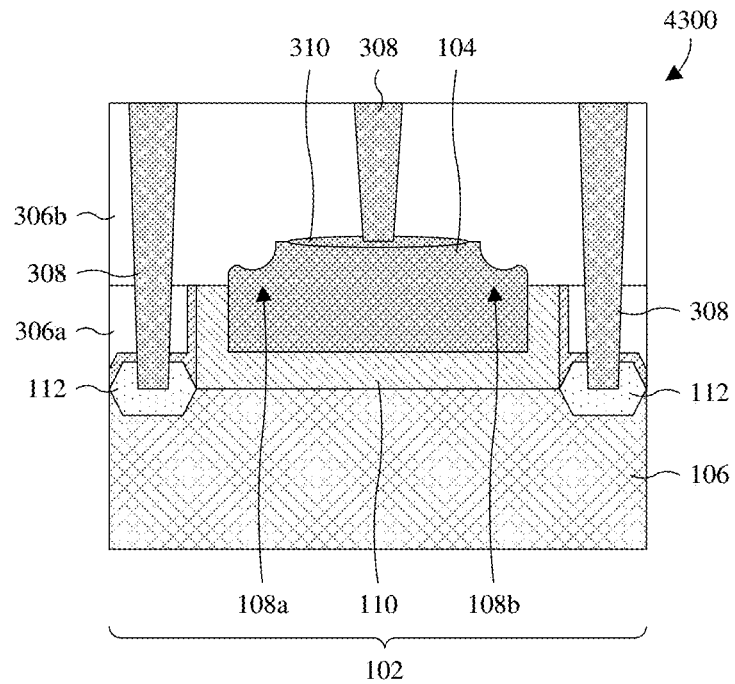

As illustrated by the cross-sectional view 4300 of FIG. 43, the second ILD layer 306b and the contact vias 308 are formed as described with regard to FIG. 24.

While FIGS. 36-43 are described with reference to various embodiments of a method, it will be appreciated that the structures shown in FIGS. 36-43 are not limited to the method but rather may stand alone separate of the method. While FIGS. 36-43 are described as a series of acts, it will be appreciated that the order of the acts may be altered in other embodiments. While FIGS. 36-43 illustrate and describe as a specific set of acts, some acts that are illustrated and/or described may be omitted in other embodiments. Further, acts that are not illustrated and/or described may be included in other embodiments.

With reference to FIGS. 44-49, a series of cross-sectional views 4400-4900 of some alternative embodiments of the method of FIGS. 36-43 is provided in which a gate electrode layer has a recessed surface recessed relative to a top surface of a gate oxide layer. The cross-sectional views 4400-4900 correspond to the cross-sectional view 800B of FIG. 8B and therefore illustrate formation of the IC and the semiconductor device 102 in FIG. 8B. However, the method illustrated by the cross-sectional views 4400-4900 may also be employed to form the IC and/or the semiconductor device 102 in any of FIGS. 6, 7A, 7B, 8A, 8C, 9, and 10.

Figure 44:
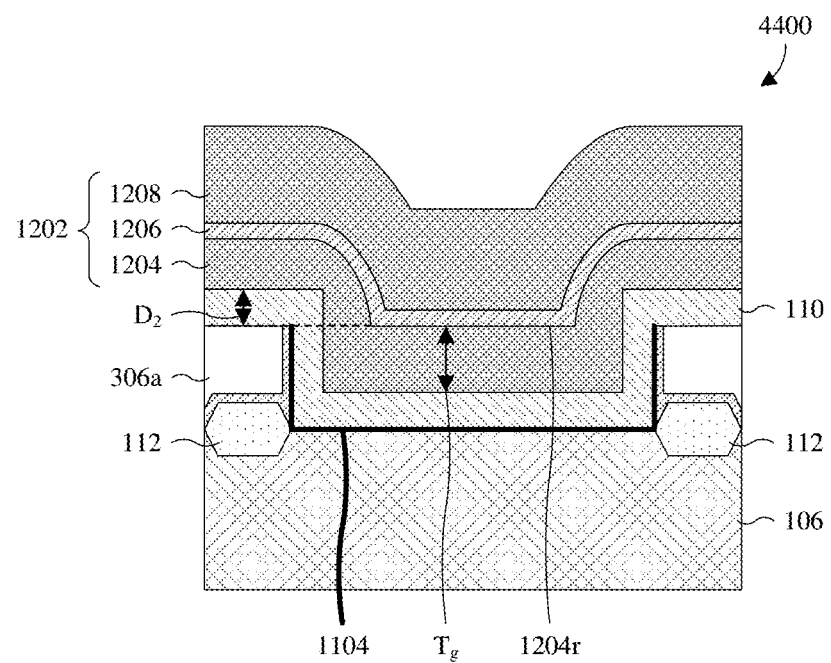
FIGS. 44-49 illustrate a series of cross-sectional views of some alternative embodiments of the method of FIGS. 36-43 in which a gate electrode layer has a recessed surface recessed relative to a top surface of a gate dielectric layer.

As illustrated by the cross-sectional view 4400 of FIG. 44, the recess 1104 is formed. Further, the gate dielectric layer 110 and the multilayer film 1202 are deposited lining the recess 1104. The recess 1104 is formed as described with regard to FIGS. 36 and 37. The gate dielectric layer 110 and the multilayer film 1202 are formed as illustrated and described respectively with regard to FIGS. 11 and 12, except that the recessed surface 1204r of the gate electrode layer 1204 is recessed below the top surface of the gate dielectric layer 110 by the distance D2.

Figure 45:
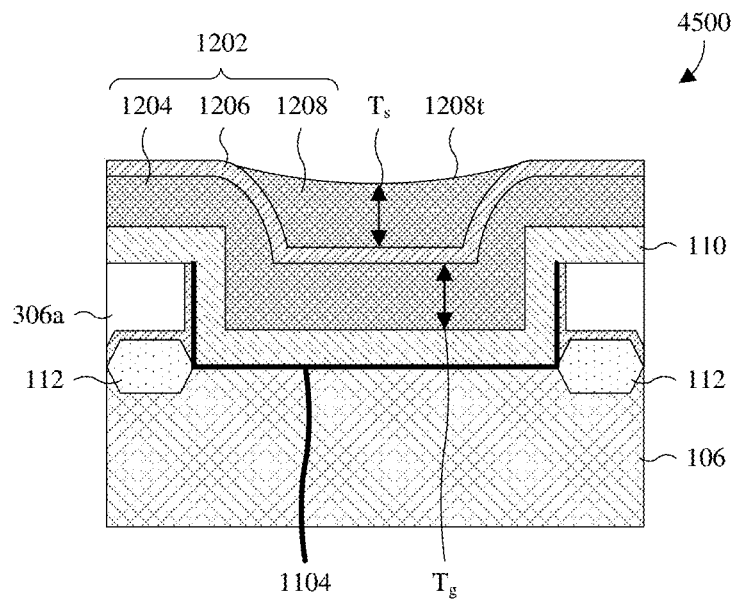

As illustrated by the cross-sectional view 4500 of FIG. 45, the first planarization is performed into the second sacrificial layer 1208 as described with regard to FIG. 13.

Figure 46:
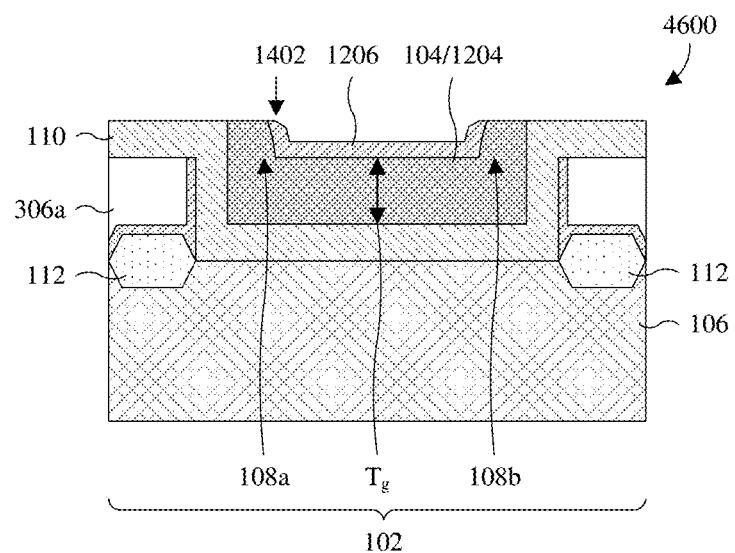

As illustrated by the cross-sectional view 4600 of FIG. 46, the first and second etches are performed respectively as described with regard to FIGS. 14 and 15 to form the recessed gate electrode 104. Because the recessed surface 1204r of the gate electrode layer 1204 is recessed below the top surface of the gate dielectric layer 110, the first and second features 108a, 108b are protrusions instead of recesses.

Figure 47:
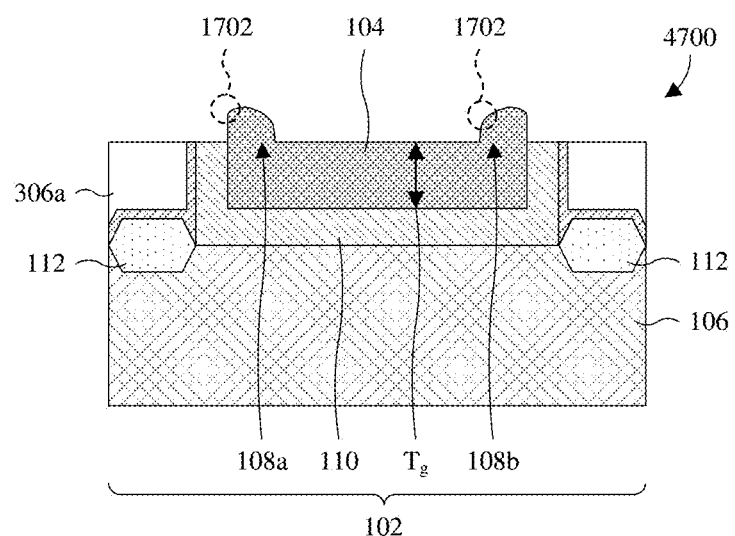

As illustrated by the cross-sectional view 4700 of FIG. 47, the third and fourth etches are performed to respectively remove: 1) the first sacrificial layer 1206 (see, e.g., FIG. 46); and 2) the gate dielectric layer 110 at sides of the recessed gate electrode 104. The third and fourth etches may, for example, be performed as described with regard to FIGS. 16 and 17.

Figure 48:
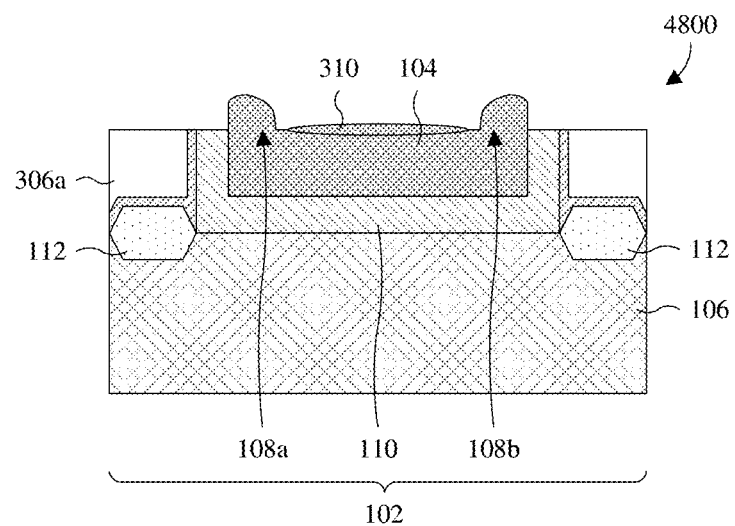

As illustrated by the cross-sectional view 4800 of FIG. 48, the silicide layer 310 is formed on the recessed gate electrode 104. The silicide layer 310 may, for example, be formed by a salicide process and/or some other suitable silicide formation process.

Figure 49:
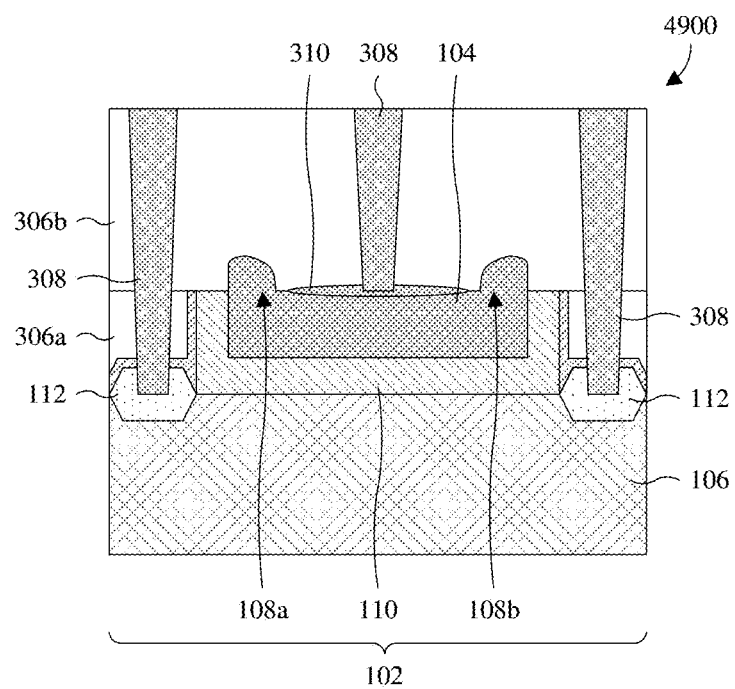

As illustrated by the cross-sectional view 4900 of FIG. 49, the second ILD layer 306b and the contact vias 308 are formed as described with regard to FIG. 24.

While FIGS. 44-49 are described with reference to various embodiments of a method, it will be appreciated that the structures shown in FIGS. 44-49 are not limited to the method but rather may stand alone separate of the method. While FIGS. 44-49 are described as a series of acts, it will be appreciated that the order of the acts may be altered in other embodiments. While FIGS. 44-49 illustrate and describe as a specific set of acts, some acts that are illustrated and/or described may be omitted in other embodiments. Further, acts that are not illustrated and/or described may be included in other embodiments.

Figure 50:
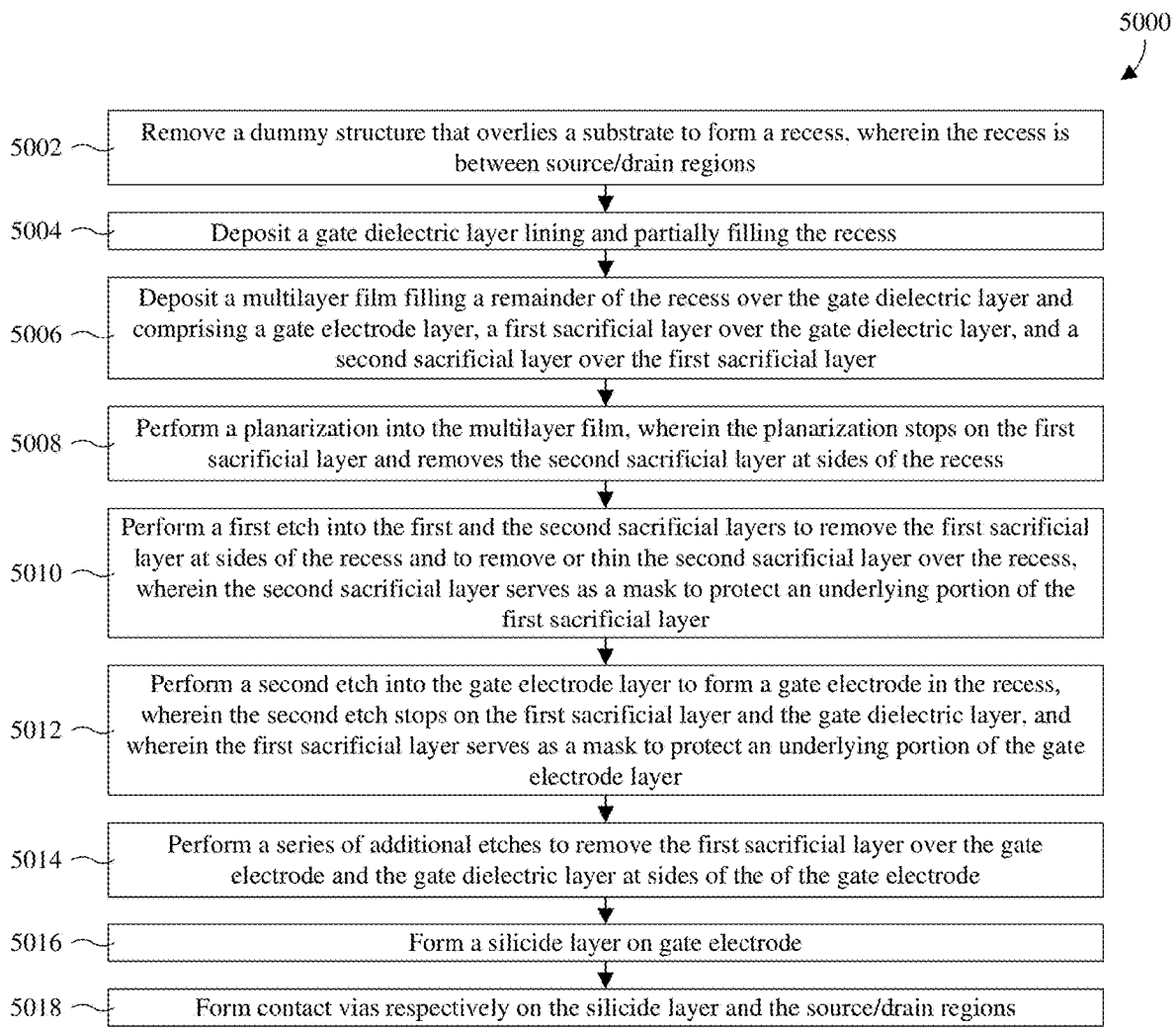
FIG. 50 illustrates a block diagram of some embodiments of the method of FIGS. 36-49.

With reference to FIG. 50, a block diagram of some embodiments of the method of FIGS. 36-49 is provided.

At 5002, a dummy structure that overlies a substrate is removed to form a recess, wherein the recess is between source/drain regions. See, for example, FIGS. 36 and 37 or FIG. 44.

At 5004, a gate dielectric layer is deposited lining and partially filling the recess. See, for example, FIG. 38 or 44.

At 5006, a multilayer film is deposited filling a remainder of the recess over the gate dielectric layer and comprising a gate electrode layer, a first sacrificial layer over the gate dielectric layer, and a second sacrificial layer over the first sacrificial layer. See, for example, FIG. 38 or 44.

At 5008, a planarization is performed into the multilayer film, wherein the planarization stops on the first sacrificial layer and removes the second sacrificial layer at sides of the recess. See, for example, FIG. 39 or 45.

At 5010, a first etch is performed into the first and the second sacrificial layers to remove the first sacrificial layer at sides of the recess and to remove or thin the second sacrificial layer over the recess, wherein the second sacrificial layer serves as a mask to protect an underlying portion of the first sacrificial layer. See, for example, FIG. 40 or 46.

At 5012, a second etch is performed into the gate electrode layer to form a gate electrode in the recess, wherein the second etch stops on the first sacrificial layer and the gate dielectric layer, and wherein the first sacrificial layer serves as a mask to protect an underlying portion of the gate electrode layer. See, for example, FIG. 40 or 46. In some embodiments, the first etch and/or the second etch is/are performed by dry etching. In some embodiments, the first and second etches are performed by a common dry etching process in a common process chamber.

At 5014, a series of additional etches is performed to remove the first sacrificial layer over the gate electrode and the gate dielectric layer at sides of the of the gate electrode. See, for example, FIG. 41 or 47. In some embodiments, the series of etches is performed by wet etching.

At 5016, a silicide layer is formed on gate electrode. See, for example, FIG. 42 or 48.

At 5018, contact vias are formed respectively on the silicide layer and the source/drain regions. See, for example, FIG. 43 or 49.

While the block diagram 5000 of FIG. 50 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a semiconductor device including: a substrate; a pair of source/drain regions in the substrate; a gate dielectric layer overlying the substrate; and a gate electrode recessed into a top of the gate dielectric layer and laterally between the source/drain regions, wherein a top surface of the gate electrode has a first edge and a second edge respectively on opposite sides of the gate electrode, wherein a thickness of the gate electrode is substantially uniform from the first edge to the second edge, and wherein the gate electrode has a pair of features respectively at the first and second edges. In some embodiments, the features are inverted rounded corners. In some embodiments, the features are upward protrusions. In some embodiments, the features are concave recesses. In some embodiments, the pair of features includes a first feature and a second feature respectively having a first cross-sectional profile and a second cross-sectional profile, wherein the first cross-sectional profile is a mirror image of the second cross-sectional profile. In some embodiments, the features are different regions of a common feature that extends laterally in a closed path to surround the top surface of the gate electrode. In some embodiments, the gate electrode is recessed into a top of the substrate and is separated from the substrate by the gate dielectric layer. In some embodiments, the substrate defines a fin protruding upward, wherein the gate electrode wraps around a top of the fin.

In some embodiments, the present disclosure provides an IC including: a substrate; a pair of source/drain regions in the substrate; a gate electrode laterally between the source/drain regions, wherein a top of the gate electrode has a feature extending laterally in a closed path along a periphery of the gate electrode, wherein the feature has a first segment and a second segment respectively on opposite sides of the gate electrode, wherein the top of the gate electrode is substantially flat from the first segment to the second segment, and wherein the feature is a protrusion or a depression; and a gate dielectric layer wrapping around a bottom of the gate electrode from a sidewall of the gate electrode to a bottom surface of the gate electrode. In some embodiments, the feature is a protrusion protruding upward. In some embodiments, the feature is an inverted corner that arcs downward with a decreasing slope from a top surface of the gate electrode to a sidewall of the gate electrode. In some embodiments, the feature is a recess. In some embodiments, the IC further includes: an ILD layer overlying the substrate and the source/drain regions, wherein the gate electrode is sunken into a top of the ILD layer, wherein the gate dielectric layer separates the gate electrode from the substrate and sidewalls of the ILD layer. In some embodiments, the gate electrode is sunken into a top of the substrate, such that a bottom surface of the gate electrode is below a top surface of the substrate.

In some embodiments, the present disclosure provides a method for forming a semiconductor device, the method including: forming a recess overlying a substrate; depositing a gate dielectric layer lining and partially filling the recess; depositing a multilayer film filling a remainder of the recess over the gate dielectric layer and including a gate electrode layer, a first sacrificial layer over the gate electrode layer, and a second sacrificial layer over the first sacrificial layer; performing a planarization into the second sacrificial layer that stops on the first sacrificial layer and removes the second sacrificial layer at sides of the recess; performing a first etch into the first and second sacrificial layers to remove the first sacrificial layer at the sides of the recess; and performing a second etch into the gate electrode layer using the first sacrificial layer as a mask to remove the gate electrode layer at the sides of the recess and to form a gate electrode underlying the first sacrificial layer in the recess. In some embodiments, the first and second etches are performed by a common dry etching process. In some embodiments, the first etch is a non-selective etch having substantially the same etch rates for the first and second sacrificial layers, and wherein the second etch is a selective etch having a high etch rate for the gate electrode layer relative to the first sacrificial layer. In some embodiments, the method further includes: performing a third etch into the first sacrificial layer after the second etch to remove the first sacrificial layer from atop the gate electrode; and performing a fourth etch to remove the gate dielectric layer at sides of the recess. In some embodiments, the third and fourth etches are performed by a common wet etching process using the same etchant. In some embodiments, the forming of the recess includes performing an etch into the substrate to form the recess in the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a pair of source/drain regions in the substrate;
   a gate dielectric layer overlying the substrate; and
   a gate electrode laterally between the source/drain regions, and overlying and recessed into the gate dielectric layer, wherein the gate electrode has a top central portion and a top peripheral portion surrounding the top central portion, and wherein the top peripheral portion is recessed relative to the top central portion and extends to a sidewall of the gate electrode;
   wherein the gate dielectric layer has a topmost edge at the sidewall, and wherein the topmost edge is recessed relative to a bottommost location of the top peripheral portion.

2. The semiconductor device according to claim 1, wherein the top central portion has a first edge and a second edge respectively on opposite sides of the gate electrode, and wherein a thickness of the gate electrode decreases continuously from the second edge to a midpoint between the first and second edges.

3. The semiconductor device according to claim 2, further comprising:
   a shallow trench isolation (STI) structure underlying the gate electrode, wherein the thickness decreases continuously from the second edge to the midpoint at locations directly over the STI structure.

4. The semiconductor device according to claim 1, wherein the top peripheral portion has a curved surface arcing continuously downward from the top central portion to the sidewall of the gate electrode.

5. The semiconductor device according to claim 1, wherein the gate dielectric layer has a first thickness directly under the gate electrode, and further has a second thickness at the topmost edge, and wherein the first and second thicknesses are transverse to each other and are substantially the same.

6. The semiconductor device according to claim 1, wherein the top peripheral portion has a concave profile and a convex profile bordering each other, and wherein the convex profile is recessed relative to a topmost elevation of the concave profile and is farther from a width-wise center of the gate electrode than the concave profile.

7. The semiconductor device according to claim 1, wherein the substrate has a first sidewall and a second sidewall that face each other respectively on opposite sides of the gate electrode, and wherein the first and second sidewalls directly contact the gate dielectric layer and have a separation about equal to a maximum width of the gate dielectric layer in a cross-sectional plane.

8. A semiconductor device, comprising:
a substrate;
a pair of source/drain regions in the substrate;
a gate electrode laterally between the source/drain regions, wherein a top of the gate electrode has a feature extending laterally in a closed path along a periphery of the gate electrode, and wherein the feature is a protrusion or a depression;
a gate dielectric layer wrapping around a bottom of the gate electrode from a sidewall of the gate electrode to a bottom surface of the gate electrode; and
a silicide layer atop the gate electrode and spaced from the feature.

9. The semiconductor device according to claim 8, further comprising:
a hard mask overlying the gate electrode, and on a sidewall of the gate dielectric layer, wherein the hard mask is spaced from the silicide layer.

10. The semiconductor device according to claim 9, wherein the hard mask completely covers the feature.

11. The semiconductor device according to claim 8, wherein the feature is the protrusion, and wherein a top of the protrusion has a concave profile and a convex profile bordering each other, and wherein the convex profile is recessed relative to a topmost elevation of the concave profile and is farther from a width-wise center of the gate electrode than the concave profile.

12. The semiconductor device according to claim 8, wherein the gate electrode is asymmetric in a cross-sectional plane, about a vertical axis at a width-wise center of the gate electrode.

13. The semiconductor device according to claim 8, wherein the feature has a first segment and a second segment respectively on opposite sides of the gate electrode, and wherein the first and second segments mirror each other in a cross-sectional plane.

14. A semiconductor device, comprising:
a substrate;
a pair of source/drain regions in the substrate;
an interlayer dielectric (ILD) layer overlying the source/drain regions;
a gate electrode having a bottom recessed relative to a top of the ILD layer and laterally between the source/drain regions, wherein a top of the gate electrode has a central portion and a peripheral portion, which surrounds the central portion and corresponds to a protrusion or a depression; and
a gate dielectric layer separating sidewalls of the gate electrode from the ILD layer and further separating the bottom of the gate electrode from the substrate, wherein the gate dielectric layer overlies the ILD layer.

15. The semiconductor device according to claim 14, wherein the peripheral portion corresponds to the protrusion, and wherein the protrusion and the gate dielectric layer have individual topmost surfaces in a cross-sectional plane that are level with each other and that are flat.

16. The semiconductor device according to claim 15, wherein the individual topmost surfaces comprise a topmost surface of the gate dielectric layer, wherein the pair of source/drain regions comprises a first source/drain region, and wherein the topmost surface of the gate dielectric layer extends across an entire width of the first source/drain region in the cross-sectional plane.

17. The semiconductor device according to claim 14, wherein the peripheral portion has a curved, concave surface, which has a first edge at the central portion and further has a second edge at a top of the gate dielectric layer, and wherein the curved, concave surface is curved continuously from the first edge to the second edge.

18. The semiconductor device according to claim 17, wherein the second edge is recessed relative to the first edge.

19. The semiconductor device according to claim 14, wherein the pair of source/drain regions comprises a first source/drain region, wherein the peripheral portion corresponds to the depression and is recessed relative to a topmost surface of the gate dielectric layer in a cross-sectional plane, and wherein the topmost surface extends across an entire width of the first source/drain region in the cross-sectional plane.

20. The semiconductor device according to claim 14, further comprising:
a silicide layer atop the central portion, laterally spaced from the peripheral portion.

* * * * *